(12) United States Patent
Yoon et al.

(10) Patent No.: US 11,443,817 B2
(45) Date of Patent: Sep. 13, 2022

(54) NONVOLATILE MEMORY DEVICE

(71) Applicant: Samsung Electronics Co., Ltd., Suwon-si (KR)

(72) Inventors: Myoung-Won Yoon, Suwon-si (KR); Jae-Hak Yun, Suwon-si (KR); Jae Woo Im, Yongin-si (KR); Sang-Hyun Joo, Suwon-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 61 days.

(21) Appl. No.: 17/026,713

(22) Filed: Sep. 21, 2020

(65) Prior Publication Data

US 2021/0233597 A1 Jul. 29, 2021

(30) Foreign Application Priority Data

Jan. 28, 2020 (KR) ........................ 10-2020-0009847

(51) Int. Cl.
| | |
|---|---|
| *G11C 16/34* | (2006.01) |
| *G11C 16/30* | (2006.01) |
| *G11C 16/16* | (2006.01) |
| *G11C 16/26* | (2006.01) |
| *G11C 16/08* | (2006.01) |

(52) U.S. Cl.
CPC .......... *G11C 16/3472* (2013.01); *G11C 16/08* (2013.01); *G11C 16/16* (2013.01); *G11C 16/26* (2013.01); *G11C 16/30* (2013.01); *G11C 16/3404* (2013.01)

(58) Field of Classification Search
CPC ..... G11C 16/3472; G11C 16/08; G11C 16/16; G11C 16/26; G11C 16/30; G11C 16/3404; G11C 16/0483; G11C 16/3445; G11C 16/32; G11C 16/14
See application file for complete search history.

(56) References Cited

U.S. PATENT DOCUMENTS

| | | |
|---|---|---|
| 7,778,084 B2 | 8/2010 | Kim et al. |
| 8,031,530 B2 | 10/2011 | Joo |
| 8,726,104 B2 | 5/2014 | Sharon |
| 8,873,288 B2 | 10/2014 | Sharon et al. |
| 9,036,412 B2 | 5/2015 | Choi et al. |
| 9,437,313 B2 | 9/2016 | Yun et al. |

(Continued)

FOREIGN PATENT DOCUMENTS

KR   2012-0098079 A   9/2012

*Primary Examiner* — Jay W. Radke
(74) *Attorney, Agent, or Firm* — Harness, Dickey & Pierce, P.L.C.

(57) ABSTRACT

A nonvolatile memory device includes processing circuitry configured to apply a sub-voltage to the first word lines, determine a desired first read voltage based on a threshold voltage distribution of a plurality of first memory cells connected to the first word lines, apply the sub-voltage to the second word lines, determine a desired second read voltage based on a threshold voltage distribution of a plurality of second memory cells connected to the second word lines, apply the desired first read voltage to the first word lines while simultaneously reading the first memory cells connected to the first word lines, and apply the desired second read voltage different from the desired first read voltage to the second word lines while simultaneously reading the second memory cells connected to the second word lines.

20 Claims, 21 Drawing Sheets

(56) References Cited

U.S. PATENT DOCUMENTS

| | | | |
|---|---|---|---|
| 9,576,671 B2 | 2/2017 | Karakulak et al. | |
| 10,360,986 B1 | 7/2019 | Hsiao et al. | |
| 2006/0034128 A1* | 2/2006 | Han | G11C 16/344 365/185.29 |
| 2007/0103974 A1* | 5/2007 | Takeguchi | G11C 16/3409 365/185.3 |
| 2016/0118143 A1* | 4/2016 | Muchherla | G11C 29/42 714/721 |
| 2019/0115078 A1 | 4/2019 | Kim et al. | |
| 2019/0267104 A1 | 8/2019 | Lee et al. | |

* cited by examiner

NONVOLATILE MEMORY DEVICE

This U.S. non-provisional application claims the benefit of priority under 35 U.S.C. § 119 to Korean Patent Application No. 10-2020-0009847, filed on Jan. 28, 2020, in the Korean Intellectual Property Office, the disclosure of which is incorporated herein in its entirety by reference.

BACKGROUND

1. Field

At least one example embodiment relates to a nonvolatile memory device.

2. Description of the Related Art

A memory device is a memory device that can store data and read the data when desired and/or necessary. Memory devices may be broadly divided into nonvolatile memories (NVMs) that do not lose stored data even when power is not supplied to the NVM, and volatile memories (VMs) that lose stored data when power is not supplied to the VM.

Characteristics of such a memory device may be changed by various causes such as the use environment, the number of uses, and/or the use time. Accordingly, the reliability of the memory device may be undermined. Therefore, methods of improving the reliability of a memory device are coming to the fore.

SUMMARY

Aspects of various example embodiments provide for a nonvolatile memory device with improved product reliability.

However, aspects of the example embodiments are not restricted to the one set forth herein. The above and other aspects of the example embodiments will become more apparent to one of ordinary skill in the art to which the example embodiments pertain by referencing the detailed description of the example embodiments given below.

According to an aspect of at least one example embodiment, there is provided a nonvolatile memory device comprising: a memory including a first memory group and a second memory group, the first memory group including a plurality of first word lines, and the second memory group including a plurality of second word lines different from the first word lines, and processing circuitry configured to simultaneously apply a sub-voltage to the first word lines, determine a desired first read voltage based on a threshold voltage distribution of a plurality of first memory cells connected to the first word lines sensed in response to the application of the sub-voltage to the first word lines, simultaneously apply the sub-voltage to the second word lines, determine a desired second read voltage based on a threshold voltage distribution of a plurality of second memory cells connected to the second word lines sensed in response to the application of the sub-voltage to the second word lines, apply the desired first read voltage to the first word lines while simultaneously reading the first memory cells connected to the first word lines, and apply the desired second read voltage different from the desired first read voltage to the second word lines while simultaneously reading the second memory cells connected to the second word lines.

According to an aspect of at least one example embodiment, there is provided a nonvolatile memory device comprising: a memory including a first memory group and a second memory group, the first memory group including a plurality of first word lines, and the second memory group including a plurality of second word lines different from the first word lines, and processing circuitry configured to perform an erase operation by applying an erase voltage to the memory in response to receiving an erase command for the memory, and apply a desired first read voltage to the first word lines and apply a desired second read voltage different from the desired first read voltage to the second word lines when performing an erase verify operation after the erase operation.

According to another aspect of at least one example embodiment, there is provided a nonvolatile memory device comprising: a first memory chip including a first memory block and first processing circuitry, and a second memory chip including a second memory block and second processing circuitry, wherein the first memory block includes a plurality of first memory cells and a plurality of first word lines connected to the first memory cells, the first processing circuitry is configured to perform a first erase operation by applying a first erase voltage to the first memory block based on a first erase command for the first memory block, and apply a desired first read voltage to the plurality first word lines while performing a first erase verify operation after performing the first erase operation, the second memory block comprises a plurality of second memory cells and a plurality of second word lines connected to the plurality of second memory cells, and the second processing circuitry is configured to perform a second erase operation by applying a second erase voltage to the second memory block based on a second erase command for the second memory block, and apply a desired second read voltage to the second word lines while performing a second erase verify operation after performing the second erase operation, and the desired first read voltage is different from the desired second read voltage.

BRIEF DESCRIPTION OF THE DRAWINGS

These and/or other aspects will become apparent and more readily appreciated from the following description of the example embodiments, taken in conjunction with the accompanying drawings in which.

DETAILED DESCRIPTION

Figure 1:
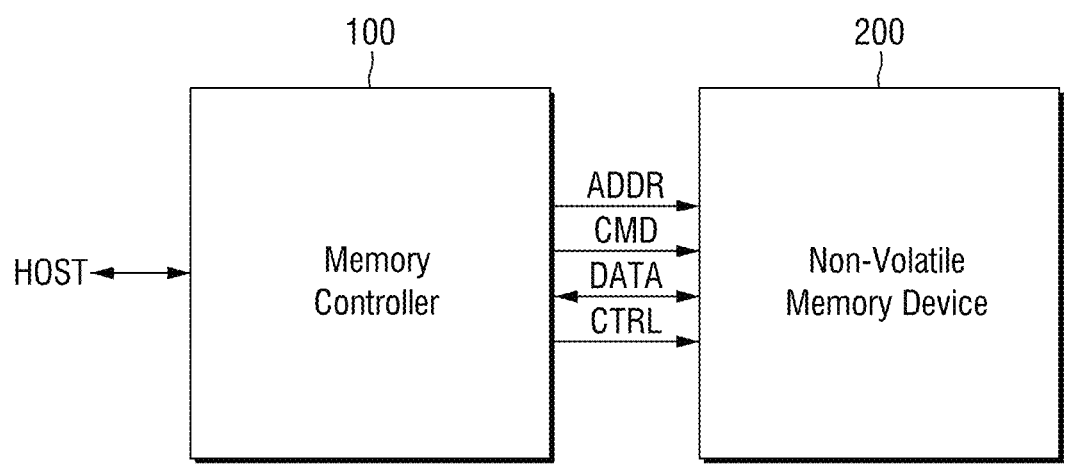
FIG. 1 is a block diagram of a nonvolatile memory system according to at least one example embodiment.

FIG. 1 is a block diagram of a nonvolatile memory system according to at least one example embodiment.

Referring to FIG. 1, the nonvolatile memory system according to at least one example embodiment may include a memory controller 100 and/or a nonvolatile memory device 200, but the example embodiments are not limited thereto and may, for example, include a greater or lesser number of constituent components, such as a plurality of nonvolatile memory devices, a plurality of memory controllers, etc.

The memory controller 100 may control the overall operation of the nonvolatile memory device 200. The memory controller 100 may provide a plurality of signals, such as a command CMD, an address ADDR, a control signal CTRL, and/or data DATA, etc., along an input/output (I/O) line connected to the nonvolatile memory device 200.

The memory controller 100 may be configured to provide an interface between the nonvolatile memory device 200 and at least one host device HOST. The memory controller 100 may access the nonvolatile memory device 200 in response to a request (e.g., instruction, command, signal, etc.) of the host device HOST. The memory controller 100 may interpret a command received from the host device HOST and control operations (e.g., program, read and erase operations) of the nonvolatile memory device 200 according to and/or based on the interpretation result. According to some example embodiments, the memory controller 100 may include hardware such as logic circuits (e.g., processing circuitry, etc.); a hardware/software combination such as at least one processor core executing software and/or executing any instruction set; or a combination thereof. For example, the memory controller 100 more specifically may include, but is not limited to, a central processing unit (CPU), an arithmetic logic unit (ALU), a digital signal processor (DSP), a graphics processing unit (GPU), a field programmable gate array (FPGA), a System-on-Chip (SoC), a programmable logic unit, a microprocessor, an application-specific integrated circuit (ASIC), etc.

The nonvolatile memory device 200 may include, for example, a NAND flash memory, a vertical NAND (VNAND) flash memory, a NOR flash memory, a resistive random access memory (RRAM), a phase-change memory (PRAM), a magneto resistive random access memory (MRAM), a ferroelectric random access memory (FRAM) or a spin transfer torque random access memory (STT-RAM), etc., but the example embodiments are not limited to these examples.

The memory controller 100 and the nonvolatile memory device 200 may each be provided as one chip, one package, or one module, but are not limited thereto. Additionally, the memory controller 100 and the nonvolatile memory device 200 may be mounted using packages such as package on package (PoP), ball grid arrays (BGAs), chip scale packages (CSPs), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flat pack (TQFP), small outline integrated circuit (SOIC), shrink small outline package (SSOP), thin small outline package (TSOP), thin quad flat pack (TQFP), system in package (SIP), multi-chip package (MCP), wafer-level fabricated package (WFP), and wafer-level processed stack package (WSP), etc.

Figure 2:
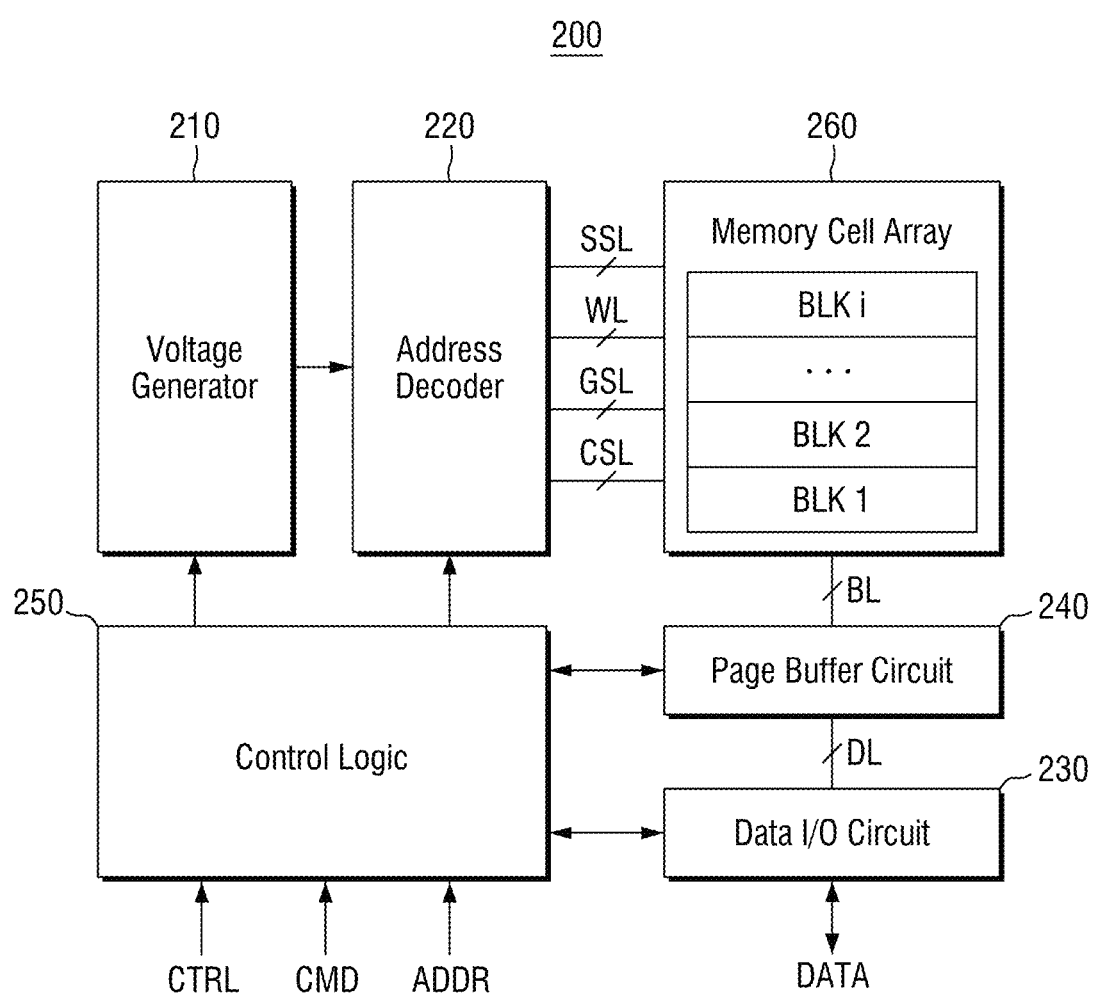
FIG. 2 is a block diagram of the nonvolatile memory device of FIG. 1 according to at least one example embodiment.

FIG. 2 is a block diagram of the nonvolatile memory device 200 of FIG. 1 according to at least one example embodiment.

Referring to FIG. 1 and FIG. 2, the nonvolatile memory device 200 may include a voltage generator 210, an address decoder 220, a data I/O circuit 230, a page buffer circuit 240, control logic 250 (e.g., control logic circuitry, control logic circuit, processing circuitry, etc.), and/or a memory cell array 260, but the example embodiments are not limited thereto and may, for example, include a greater or lesser number of constituent components.

The voltage generator 210 may generate operating voltages desired and/or required for the nonvolatile memory device 200 by using a power supply voltage. The operating voltages may include, for example, a program voltage, a pass voltage, a read voltage, a read pass voltage, a verify voltage, an erase voltage, a bit line voltage, and/or a common source voltage, etc., but the example embodiments are not limited thereto.

The address decoder 220 may select any one of a plurality of memory blocks BLK1 through BLKi in response to the address ADDR. In addition, the address decoder 220 may be connected to the memory cell array 260 through a plurality of word lines WL, at least one string select line SSL, and/or at least one ground select line GSL, etc., but is not limited thereto.

The data I/O circuit 230 may be connected to the control logic 250. The data I/O circuit 230 may perform operations, such as input and output operations, based on operation signals from the control logic 250. The data I/O circuit 230 may provide the address ADD, the command CMD, and/or the control signal CTRL, etc., received from memory controller 100 to the control logic 250, but the example embodiments are not limited thereto.

The page buffer circuit 240 may be connected to the memory cell array 260 through the bit lines BL. According to at least one example embodiment, the page buffer circuit 240 may provide the same voltage to each of the bit lines BL during an erase operation, but is not limited thereto. The page buffer circuit 240 may receive operation signals from the control logic 250. The page buffer circuit 240 may perform operations such as erase, verify and/or program operations, etc., according to and/or based on the operation signals from the control logic 250.

The control logic 250 may generate operation signals such as erase, verify, and/or program signals based on the command CMD and/or the control signal CTRL from the memory controller 100. The control logic 250 may provide the generated operation signals to the voltage generator 210, the address decoder 220, the page buffer circuit 240, or the data I/O circuit 230. If desired and/or necessary, the nonvolatile memory device 200 may include more elements or less elements than the illustrated elements. According to some example embodiments, the control logic 250 may be processing circuitry and may include hardware such as logic circuits (e.g., control logic circuitry, etc.); a hardware/software combination such as at least one processor core executing software and/or executing any instruction set; or a combination thereof. For example, the control logic 250 more specifically may include, but is not limited to, a central processing unit (CPU), an arithmetic logic unit (ALU), a digital signal processor (DSP), a field programmable gate array (FPGA), a System-on-Chip (SoC), a programmable logic unit, a microprocessor, an application-specific integrated circuit (ASIC), etc.

The control logic 250 may store and/or pre-store a read voltage to be applied and/or simultaneously applied to a plurality of word lines included in each memory group when memory cells connected to the word lines are read and/or simultaneously read. A memory group may refer to a group including a plurality of word lines, for example, may refer to a group of a plurality of word lines, a memory block, and/or a memory chip, etc.

When the control logic 250 reads and/or simultaneously reads memory cells connected to a plurality of word lines, it may control the desired and/or predetermined read voltage to be applied to the corresponding word lines during the operation, e.g., an erase verify operation, etc. This will be described in detail later with reference to FIGS. 5 through 11.

The memory cell array 260 may include a plurality of memory blocks BLK1 through BLKi. Each of the memory blocks BLK1 through BLKi may be connected to the address decoder 220 through a plurality of word lines WL, at least one string select line SSL, at least one ground select line GSL, and/or a common source line CSL, but are not limited thereto. In addition, each of the memory blocks BLK1 through BLKi may be connected to the page buffer circuit 240 through a plurality of bit lines BL. The memory cell array 260 may be a two-dimensional memory cell array or a three-dimensional memory cell array.

Figure 3:
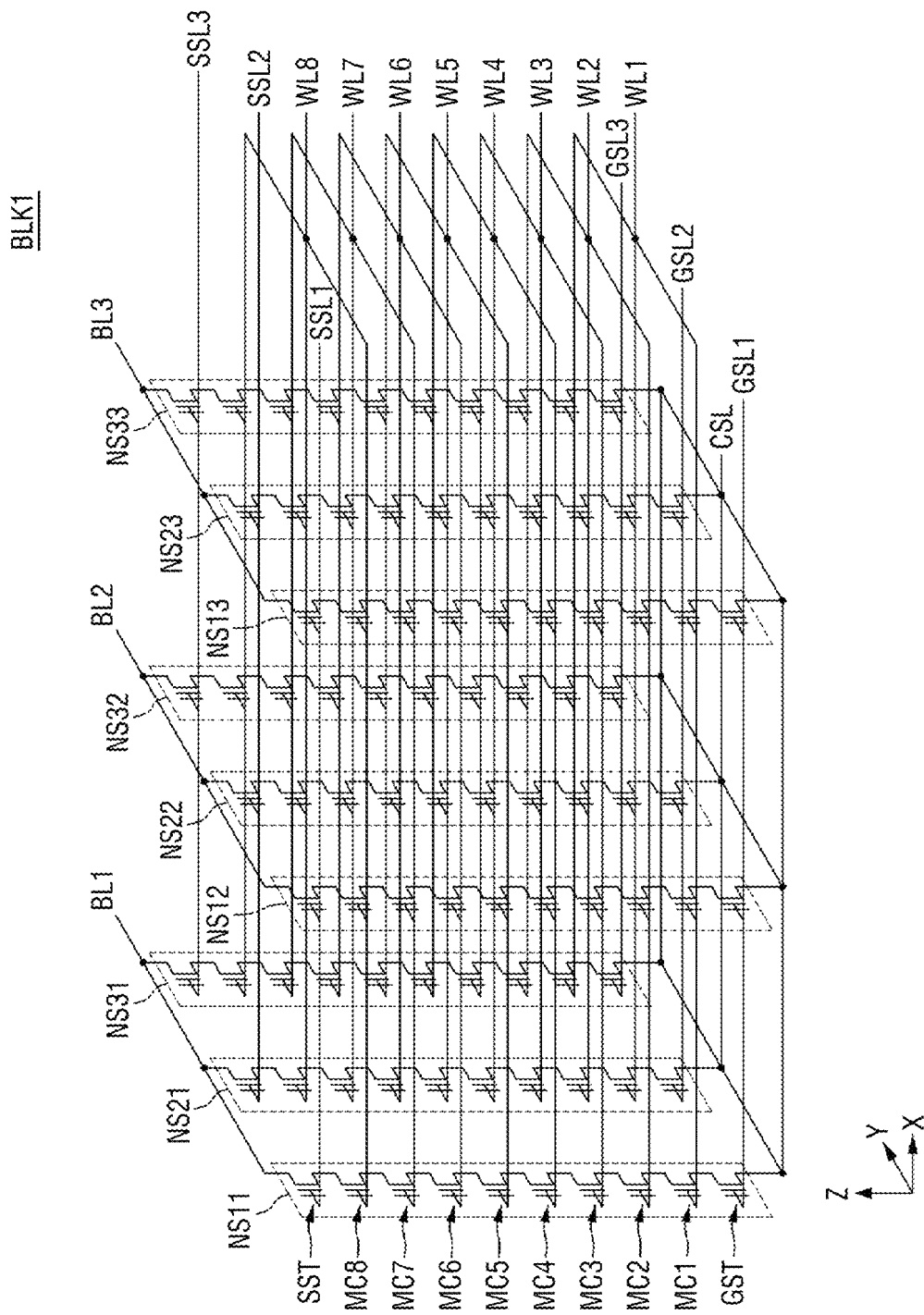
FIG. 3 is an example circuit diagram of a memory block of FIG. 2 according to at least one example embodiment.

FIG. 3 is an example circuit diagram of a memory block BLK1 of FIG. 2 according to at least one example embodiment.

Referring to FIG. 3, a plurality of cell strings NS11 through NS33 may be between a plurality of bit lines BL1 through BL3 and a common source line CSL, but the example embodiments are not limited thereto. Each cell string (e.g., NS11) may include a ground select transistor GST, a plurality of memory cells MC1 through MC8, and/or a string select transistor SST, etc.

The string select transistors SST may be connected to a string select line SSL. For example, the string select line SSL may be divided into first through third string select lines SSL1 through SSL3, but the example embodiments are not limited thereto. The ground select transistors GST may be connected to ground a plurality of select lines, such as GSL1 through GSL3, etc. In some example embodiments, the ground select lines, e.g., GSL1 through GSL3, may be connected to each other. The string select transistors SST may be connected to a plurality of bit lines, e.g., BL1 though BL3, etc., and the ground select transistors GST may be connected to the common source line CSL.

The memory cells, e.g., MC1 through MC8, etc., may be connected to a corresponding plurality of word lines, e.g., WL1 through WL8, etc., respectively. A set of memory cells connected to one word line and programmed simultaneously may be called a page. The memory block BLK1 may include a plurality of pages as illustrated in the drawing. In addition, a plurality of pages may be connected to one word line. For example, a word line located at the same height from the common source line CSL (e.g., WL4) may be connected in common to three pages, but the example embodiments are not limited thereto.

The page may be a unit for data programming (e.g., writing) and reading, and the memory block BLK1 may be a unit for data erasing. That is, data may be programmed (e.g., writing) and/or read on a page-by-page basis when the nonvolatile memory device 200 performs a program and/or read operation and may be erased on a memory block-by-memory block basis when the nonvolatile memory device 200 performs an erase operation. That is, data stored in all of the memory cells, e.g., MC1 through MC8, included in one memory block may be erased at once.

Each of the memory cells, e.g., MC1 through MC8, etc., may store 1 bit of data or 2 or more bits of data. Each of the memory cells, e.g., MC1 through MC8, may be, for example, a single level cell (SLC) that records 1 bit of data or a multi-level cell (MLC) that stores 2 or more bits of data. The multi-level cell may be, for example, a triple level cell (TLC) that records 3 bits of data, a quadruple level cell (QLC) that records 4 bits of data, etc.

Figure 4A:
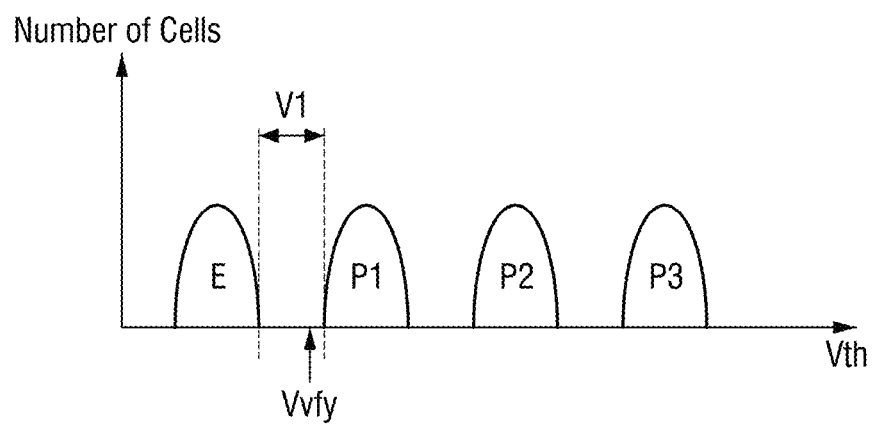
FIGS. 4A and 4B illustrate threshold voltage distributions of memory cells of FIG. 3 according to at least one example embodiment.
Figure 4B:
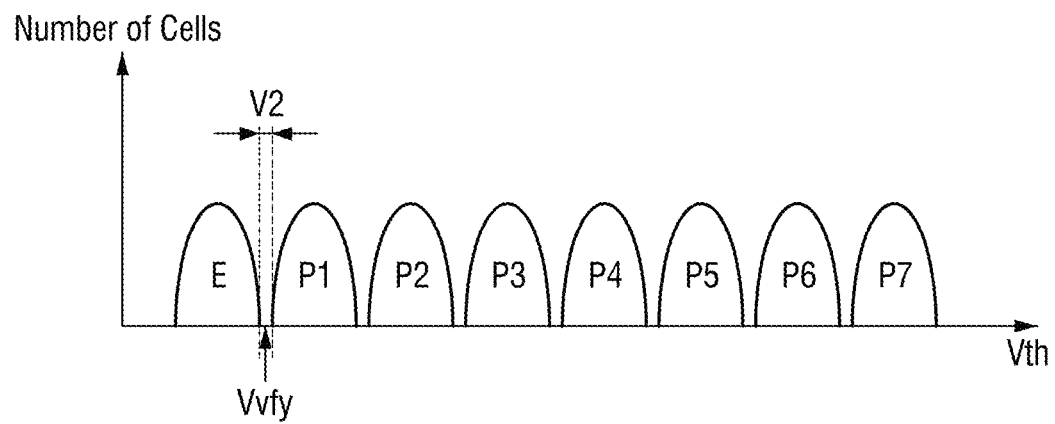

FIGS. 4A and 4B illustrate threshold voltage distributions of the memory cells MC1 through MC8 of FIG. 3 according to some example embodiments. In FIGS. 4A and 4B, the horizontal axis represents a desired threshold voltage, and the vertical axis represents the number of memory cells. FIG. 4A illustrates an example threshold voltage distribution in a case where the memory cells MC1 through MC8 (see FIG. 3) are multi-level cells that store 2 bits of data, and FIG. 4B illustrates an example threshold voltage distribution in a case where the memory cells MC1 through MC8 (see FIG. 3) are multi-level cells that store 4 bits of data, but the example embodiments are not limited thereto.

Referring to FIGS. 3 and 4A, the memory cells MC1 through MC8 may be programmed to have an erase state E and first through third states P1 through P3, but the example embodiments are not limited thereto. When an erase verify operation is performed after an erase operation is performed on the memory cells MC1 through MC8, an erase verify voltage Vvfy may be applied to the memory cells MC1 through MC8. For example, after the erase verify voltage Vvfy is applied, the result of the erase operation, e.g., erase pass or erase fail, may be determined according to the number of on cells and off cells among the memory cells MC1 through MC8. Here, a difference between a first threshold voltage (e.g., a high threshold voltage, a maximum threshold voltage, etc.) in the erase state E and a second threshold voltage (e.g., a low threshold voltage, a minimum threshold voltage, etc.) in the first state P1 may be a first voltage V1.

Referring to FIGS. 3 and 4B, the memory cells MC1 through MC8 may have an erase state E and first through seventh program states P1 through P7, but the example embodiments are not limited thereto. When an erase verify operation is performed after an erase operation is performed on the memory cells MC1 through MC8, the erase verify voltage Vvfy may be applied to the memory cells MC1 through MC8. For example, after the erase verify voltage Vvfy is applied, the result of the erase operation, e.g., erase pass or erase fail, may be determined according to the number of on cells and off cells among the memory cells MC1 through MC8. Here, a difference between a first threshold voltage (e.g., a high threshold voltage, a maximum threshold voltage, etc.) in the erase state E and a second threshold voltage (e.g., a low threshold voltage, a minimum threshold voltage, etc.) in the first state P1 may be a second voltage V2.

The first voltage V1 may be greater than the second voltage V2, but the example embodiments are not limited thereto. That is, as the memory cells MC1 through MC8 have a multi-level cell structure, a sensing margin of erase verification may decrease, and the importance of setting the erase verify voltage Vvfy may increase, but the example embodiments are not limited thereto. Here, the erase verify voltage Vvfy may be determined and/or set at any time, such as before the shipment of the nonvolatile memory device 200, but is not limited thereto.

Therefore, the nonvolatile memory device 200 according to at least one example embodiment may determine a read voltage in advance according to a situation (e.g., an erase verify operation) in which memory cells connected to a plurality of word lines are simultaneously read and may apply the desired and/or predetermined read voltage to the word lines when simultaneously reading the memory cells connected to the word lines. Accordingly, the sensing margin can be secured.

FIGS. 5 through 10 are diagrams for explaining the operation of a nonvolatile memory device according to some example embodiments.

Each of a plurality of groups, such as Group 1 through Group 4, may include two or more word lines, but the example embodiments are not limited thereto. Here, memory cells may be erased before product shipment, but are not limited thereto. In FIGS. 5 to 10, a dash-dotted line represents Group 1, a dashed line represents Group 2, a thick solid line represents Group 3, and a solid line represents Group 4. Each of Group 1 through Group 4 may be, for example, a group of memory cells generated by a specific process, a group of memory cells included in a specific memory block, a group of memory cells included in a specific chip, and/or a group of memory cells included in a specific area, etc.

Figure 5:
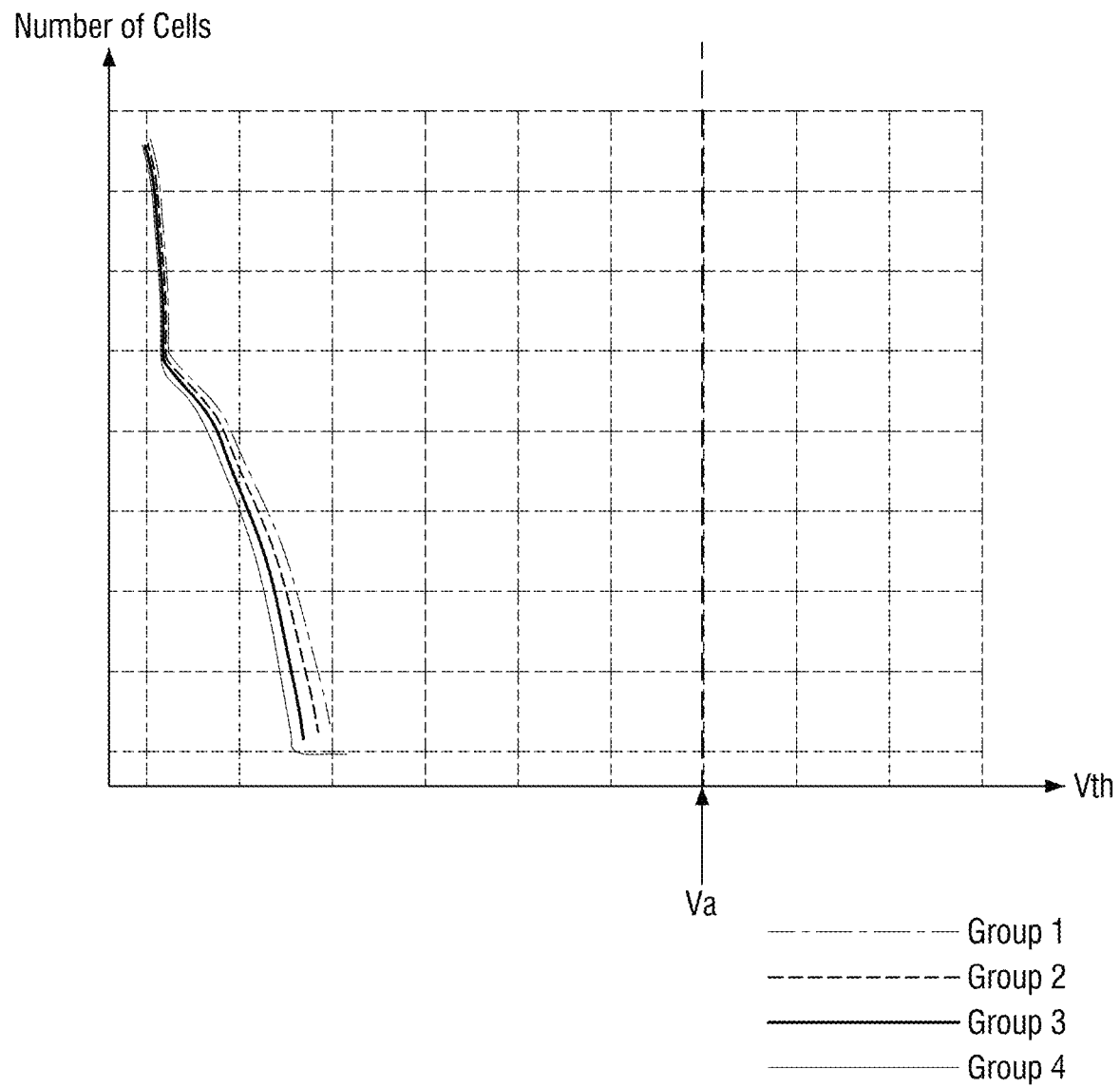
FIGS. 5 through 10 are diagrams for explaining the operation of a nonvolatile memory device according to some example embodiments.

FIG. 5 illustrates the threshold voltage distribution of memory cells connected to one word line read by applying a sub-voltage to the word line among the word lines included in each of Group 1 through Group 4 according to some example embodiments. Here, the horizontal axis represents the threshold voltage, and the vertical axis represents the number of memory cells. The threshold voltage distribution of the memory cells may be checked by sequentially applying a plurality of sub-voltages, but the example embodiments are not limited thereto.

Referring to FIG. 5, the threshold voltage distribution of memory cells connected to one word line may be similar in Group 1 through Group 4 although it may differ slightly depending on characteristics of the memory cells according to a process of each group or a location where each group is located, but the example embodiments are not limited thereto.

Figure 6:
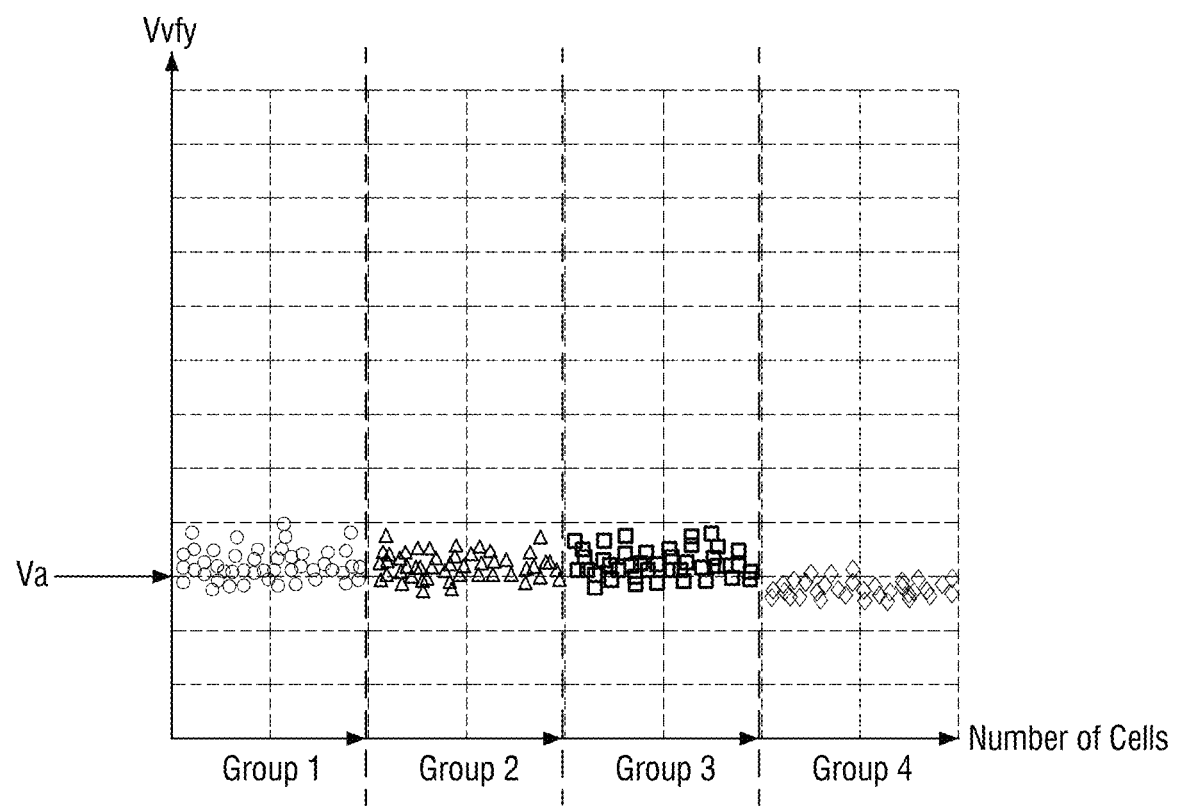

FIG. 6 illustrates the erase verify voltage Vvfy according to the threshold voltage distribution of memory cells connected to one word line included in each of Group 1 through Group 4 according to some example embodiments. Here, the horizontal axis represents the number of memory cells, and the vertical axis represents the erase verify voltage Vvfy.

Referring to FIG. 6, the level of the erase verify voltage Vvfy may be set according to the threshold voltage distribution of memory cells connected to one word line included in each of Group 1 through Group 4 as illustrated in FIG. 5, but the example embodiments are not limited thereto. Since the threshold voltage distribution of the memory cells connected to one word line is similar in Group 1 through Group 4, the erase verify voltage Vvfy may be set to a third voltage Va. That is, the third voltage Va may be an erase verify voltage beneficially and/or optimally set for a case where memory cells connected to one word line are read.

Figure 7:
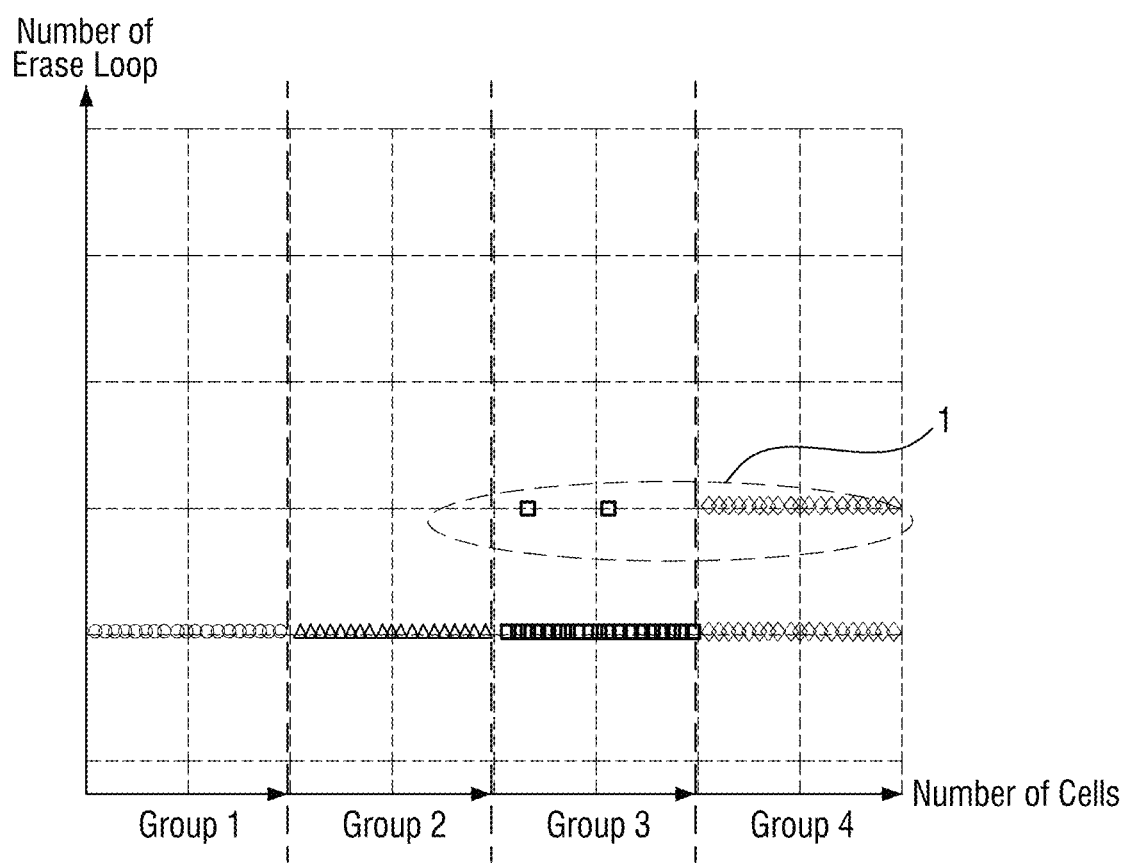

FIG. 7 illustrates erase loops counted when the erase verify voltage Vvfy of each of Group 1 through Group 4 is the third voltage Va according to some example embodiments. Here, the horizontal axis represents the number of memory cells, and the vertical axis represents erase loops counted until an erase operation is terminated.

Referring to FIG. 7, a shipped nonvolatile memory device may perform an erase loop in response to an erase command, but the example embodiments are not limited thereto. The erase loop may include an erase operation and an erase verify operation, but is not limited thereto. In an erase loop, the erase operation may be terminated in the case of an erase pass result in response to the erase verify operation. On the other hand, the erase loop may be counted in the case of an erase fail result in response to the erase verify operation, and a next erase loop may be performed.

The number of counted erase loops of each of Group 1 and Group 2 may be 1, but the example embodiments are not limited thereto. That is, each of Group 1 and Group 2 may be erased by performing a first erase loop. On the other hand, the number of counted erase loops of each of Group 3 and Group 4 may be 1 or 2, but the example embodiments are not limited thereto, and the number of counted erase loops may be greater than 2. Each of Group 3 and Group 4 may include memory cells that are erased by performing the first erase loop and memory cells 1 that are erased by performing the first erase loop and a second erase loop, that is, two erase loop operations, etc.

That is, all of the memory cells included in each of Group 1 through Group 4 may be in an erase-pass state, but there may be the memory cells 1, as shown in FIG. 7, where an additional erase loop will be performed due to the erase verify voltage Vvfy having the third voltage Va. This will be described in detail below with reference to FIG. 8.

Figure 8:
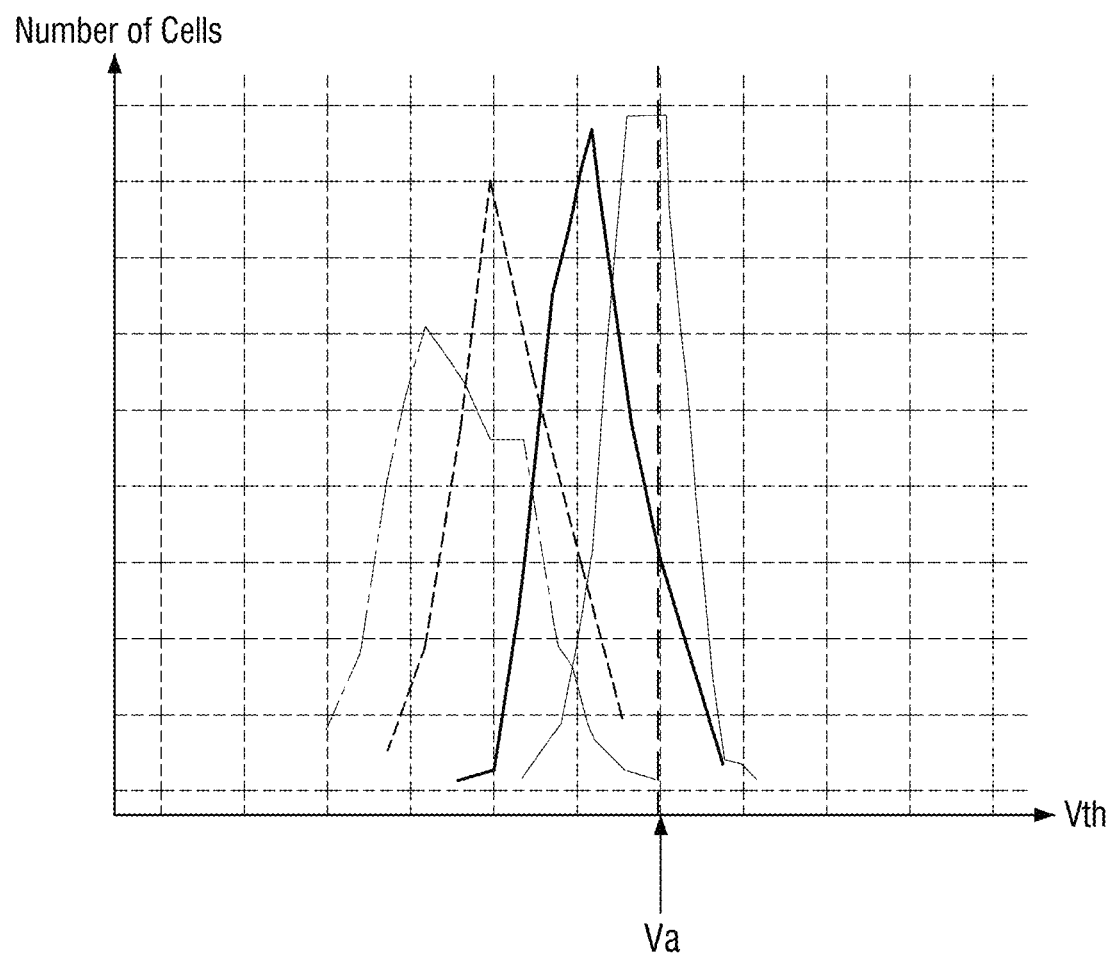

FIG. 8 illustrates the threshold voltage distribution of memory cells connected to all word lines read by simultaneously applying a sub-voltage to the word lines included in each of Group 1 through Group 4 according to some example embodiments. Here, the horizontal axis represents the threshold voltage, and the vertical axis represents the number of memory cells. The threshold voltage distribution of the memory cells may be checked by sequentially applying a plurality of sub-voltages, but the example embodiments are not limited thereto.

As illustrated in FIG. 8, there may be memory cells having threshold voltages equal to or higher than the third voltage Va, but the example embodiments are not limited thereto. Therefore, for example, when the erase verify voltage Vvfy is the third voltage Va, there may be memory cells that are in an erase-fail state, and an erase loop may be additionally performed as illustrated in FIG. 7. That is, all of the memory cells included in each of Group 1 through Group 4 may be in the erase-pass state, but there may exist memory cells 1 (see FIG. 7) which have deteriorated as a result of being excessively erased (e.g., unnecessarily erased) due to the third voltage Va.

Referring to FIG. 8, the threshold voltage distribution of memory cells may be more affected by the characteristics of the memory cells when memory cells connected to all the word lines included in each of Group 1 through Group 4 are simultaneously read than when memory cells connected to one word line are read, but the example embodiments are not limited thereto. Here, the characteristics of the memory cells may be determined according to a manufacturing process of the memory cells and positions of the memory cells, but are not limited thereto, and for example, the characteristics of the memory cells may change over time due to continued use of the memory cells, etc.

Therefore, when the memory cells connected to all of the word lines included in each of the groups, e.g., Group 1 through Group 4, are simultaneously read (when memory cells connected to a plurality of word lines are simultaneously read), the threshold voltage distribution of the memory cells of each of the groups, e.g., Group 1 through Group 4, may be different from the threshold voltage distribution illustrated in FIG. 5 because the characteristics (e.g., physical characteristics, electrical characteristics, etc.) of the memory cells included in each of the groups, Group 1 through Group 4, are different. The threshold voltage distribution of the memory cells when the memory cells connected to all of the word lines included in each of the groups, e.g., Group 1 through Group 4, are simultaneously read may be shifted to the right (e.g., increased) compared with the threshold voltage distribution of the memory cells when the memory cells connected to one word line are read. That is, the threshold voltages may increase.

Figure 9:
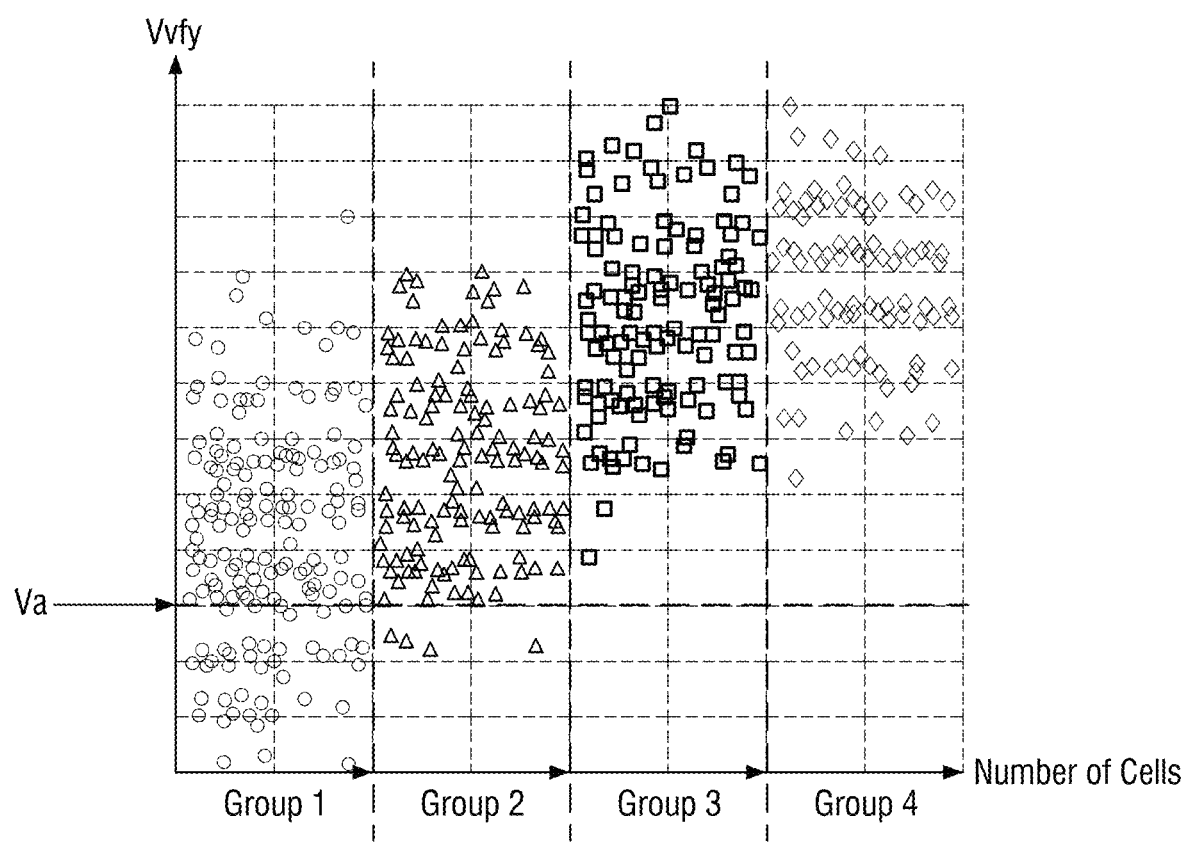

FIG. 9 illustrates the erase verify voltage Vvfy determined according to the threshold voltage distribution of memory cells when the memory cells connected to all the word lines included in each of the groups, e.g., Group 1 through Group 4, etc., are simultaneously read as illustrated in FIG. 8 according to some example embodiments. When the memory cells connected to all the word lines included in each of the groups, e.g., Group 1 through Group 4, are simultaneously read, the threshold voltage distribution of the memory cells may be different in each of the groups, Group 1 through Group 4, etc. Therefore, the erase verify voltage Vvfy of each of the groups, e.g., Group 1 through Group 4, etc., may be set to a different voltage, but the example embodiments are not limited thereto.

The nonvolatile memory device according to at least one example embodiment may check the threshold voltage distribution of memory cells connected to a plurality of word lines included in each of the groups, Group 1 through Group 4, by simultaneously applying a sub-voltage to the word lines and may determine the erase verify voltage Vvfy in advance based on the threshold voltage distribution. The erase verify voltage Vvfy may be desired and/or predetermined according to characteristics of memory cells included in each memory group to be improved and/or optimal for a case where memory cells connected to a plurality of word lines are simultaneously read.

Figure 10:
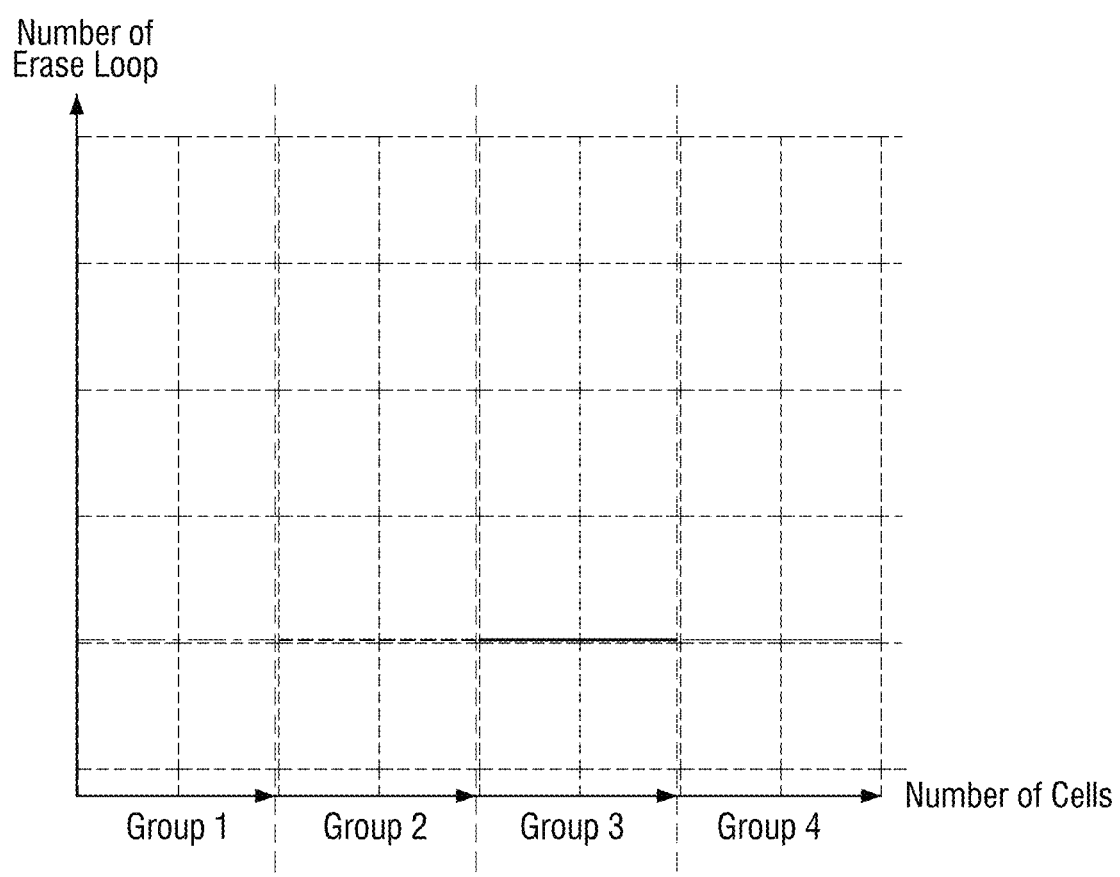

FIG. 10 illustrates erase loops counted for each of Group 1 through Group 4 during an erase operation when the erase verify voltage Vvfy is determined as illustrated in FIG. 9 according to some example embodiments.

Referring to FIG. 10, the respective numbers of erase loops counted for Group 1 through Group 4 may all be 1, but the example embodiments are not limited thereto. Each of Group 1 through Group 4 may be erased by performing the same number of erase loops, but are not limited thereto.

That is, compared with FIG. 7, the nonvolatile memory device according to at least one example embodiment does not perform an excessive erase operation on memory cells due to the erase verify voltage Vvfy. Therefore, the deterioration of the memory cells can be improved and/or prevented, and power consumption can be reduced by not performing and/or preventing additional erase loops.

Figure 11:
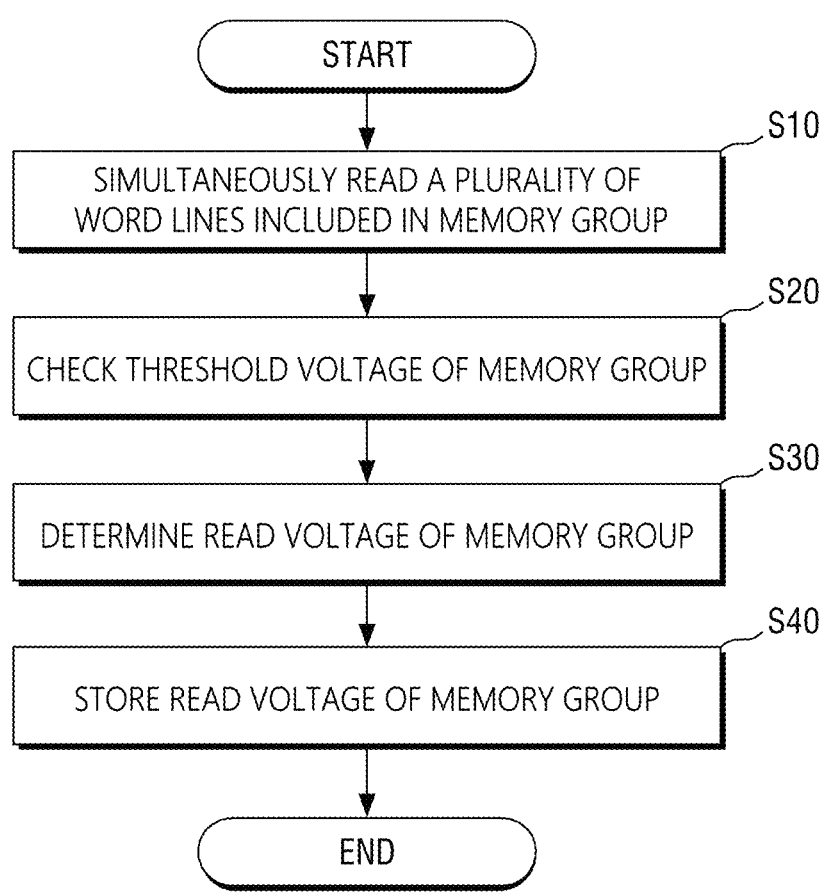
FIG. 11 is a flowchart illustrating a method of operating a nonvolatile memory device according to at least one example embodiment.

FIG. 11 is a flowchart illustrating a method of operating a nonvolatile memory device according to at least one example embodiment.

Referring to FIG. 11, the method of operating the nonvolatile memory device according to at least one example embodiment may begin by reading memory cells of a plurality of word lines included in a memory group by simultaneously applying a sub-voltage to the word lines (operation S10). Here, the memory group may be, for example, a group of memory cells generated by a specific process, a group of memory cells included in a specific memory block, a group of memory cells included in a specific chip, a group of memory cells included in a specific area, and/or a group of memory chips connected to a specific channel, etc. That is, the memory group may refer to any unit including a plurality of word lines.

Next, a threshold voltage of the memory group may be checked (operation S20). For example, the threshold voltage of the memory group may be checked by performing a plurality of read operations by sequentially applying first through $N^{th}$ sub-voltages to the plurality of word lines included in the memory group.

Next, a read voltage of the memory group may be determined according to the checked threshold voltages of the memory cells included in the memory group (operation S30).

Next, the determined read voltage of the memory group may be stored in, for example, the control logic 250 (see FIG. 2), but is not limited thereto. Then, the control logic 250 (see FIG. 2) included in the shipped nonvolatile memory device may apply the stored read voltage to the word lines when simultaneously reading the memory cells connected to the word lines included in the memory group.

Therefore, the nonvolatile memory device according to one or more example embodiments can simultaneously read memory cells connected to a plurality of word lines included in a memory group by using a desired and/or predetermined read voltage which is improved and/or optimized for a case where the memory cells connected to the word lines included in the memory group are simultaneously read.

FIGS. 12 through 16 are diagrams for explaining the operation of nonvolatile memory devices according to some example embodiments when a memory group is a group including a plurality of word lines.

Figure 12:
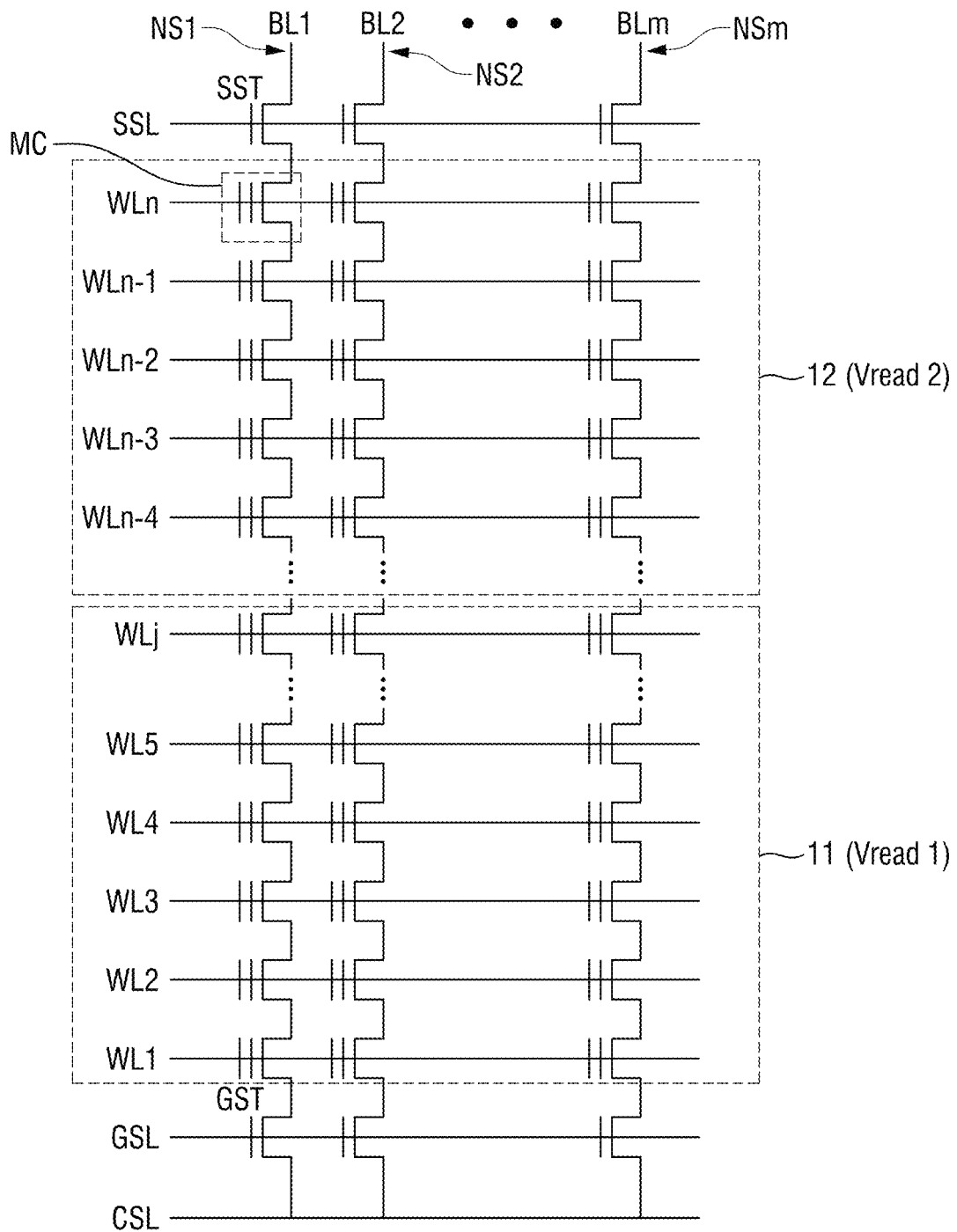
FIGS. 12 through 16 are diagrams for explaining the operation of nonvolatile memory devices according to some example embodiments.

Referring to FIG. 12, a nonvolatile memory device according to at least one example embodiment may include a first memory group 11 including a plurality of first word lines WL1 through WLj and a second memory group 12 including a plurality of second word lines WLj+1 through WLn, but the example embodiments are not limited thereto and there may be more or less memory groups and/or more or less word lines included in each memory group. The first memory group 11 and the second memory group 12 may be included in one memory block, but are not limited thereto. The first word lines WL1 through WLj and the second word lines WLj+1 through WLn may have the same structure, but are not limited thereto. First memory cells connected to the first word lines WL1 through WLj and second memory cells connected to the second word lines WLj+1 through WLn may have the same structure, but are not limited thereto.

According to at least one example embodiment, the first memory group 11 may be above the second memory group 12, but is not limited thereto. For example, the first word lines WL1 through WLj may be above the second word lines WLj+1 through WLn, etc.

When the control logic 250 (see FIG. 2) simultaneously reads the first memory cells connected to the first word lines WL1 through WLj included in the first memory group 11, it may simultaneously apply a first read voltage Vread 1 to the first word lines WL1 through WLj. Here, the first read voltage Vread 1 may be a desired voltage determined and/or set at any time, such as before the shipment of the nonvolatile memory device.

The first read voltage Vread 1 may be a desired voltage determined and/or set at any time, such as before the shipment of the nonvolatile memory device, etc., in consideration of the threshold voltage distribution of the first memory cells connected to the first word lines WL1 through WLj read by simultaneously applying a sub-voltage to the first word lines WL1 through WLj. That is, the first read voltage Vread 1 may be a desired voltage that is improved and/or optimal for a case where the first memory cells connected to the first word lines WL1 through WLj are simultaneously read.

When the control logic 250 (see FIG. 2) simultaneously reads the second word lines WLj+1 through WLn included in the second memory group 12, it may simultaneously apply a second read voltage Vread 2 to the second word lines WLj+1 through WLn.

The second read voltage Vread 2 may be a desired voltage determined and/or set at any time, such as before the shipment of the nonvolatile memory device, etc., in consideration of the threshold voltage distribution of the second memory cells connected to the second word lines WLj+1 through WLn read by simultaneously applying a sub-voltage to the second word lines WLj+1 through WLn. That is, the second read voltage Vread 2 may be a desired voltage improved and/or optimal for a case where the second word lines WLj+1 through WLn are simultaneously read.

The first read voltage Vread 1 and the second read voltage Vread 2 may be different voltages, but are not limited thereto.

When the control logic 250 (see FIG. 2) simultaneously reads the first word lines WL1 through WLj included in the first memory group 11 and the second word lines WLj+1 through WLn included in the second memory group 12, it may simultaneously apply the first read voltage Vread 1 to the first word lines WL1 through WLj and the second read voltage Vread 2 to the second word lines WLj+1 through WLn. Additionally, according to some example embodiments, the control logic 250 may include a plurality of control logic circuits, a plurality of control logic circuitry, and/or a plurality of processing circuitry, etc., associated with each of the plurality of memory groups connected to the control logic 250. For example, the control logic 250 may include a first control logic and/or first processing circuitry (not shown) connected to the first memory group 11, and a second control logic and/or second processing circuitry (not shown) connected to the second memory group 12, etc., but the example embodiments are not limited thereto.

When the control logic 250 (see FIG. 2) performs, for example, an erase verify operation on the memory block including the first memory group 11 and the second memory group 12, it may control the erase verify operation to be performed on the first and second memory cells included in the first memory group 11 and the second memory group 12 by applying an erase verify voltage to each of the first memory group 11 and the second memory group 12. The control logic 250 (see FIG. 2) may control a first erase verify operation on the first memory cells included in the first memory group 11 and a second erase verify operation on the second memory cells included in the second memory group 12 to be performed sequentially or simultaneously. Therefore, the control logic 250 (see FIG. 2) may simultaneously apply the second read voltage Vread 2 to the second word lines WLj+1 through WLn included in the second memory group 12 after, or at the same time, as simultaneously applying the first read voltage Vread 1 to the first word lines WL1 through WLj included in the first memory group 11, but the example embodiments are not limited thereto.

The above applies to some example embodiments of the inventive concepts, and the example embodiments are not limited thereto. The second memory group 12 may also be above the first memory group 11, and the second word lines WLj+1 through WLn may also be above the first word lines WL1 through WLj, etc. In addition, since the first memory group 11 and the second memory group 12 only have to include a plurality of word lines, the number of the first word lines WL1 through WLj and the number of the second word lines WLj+1 through WLn may be any number greater than one.

Figure 13:
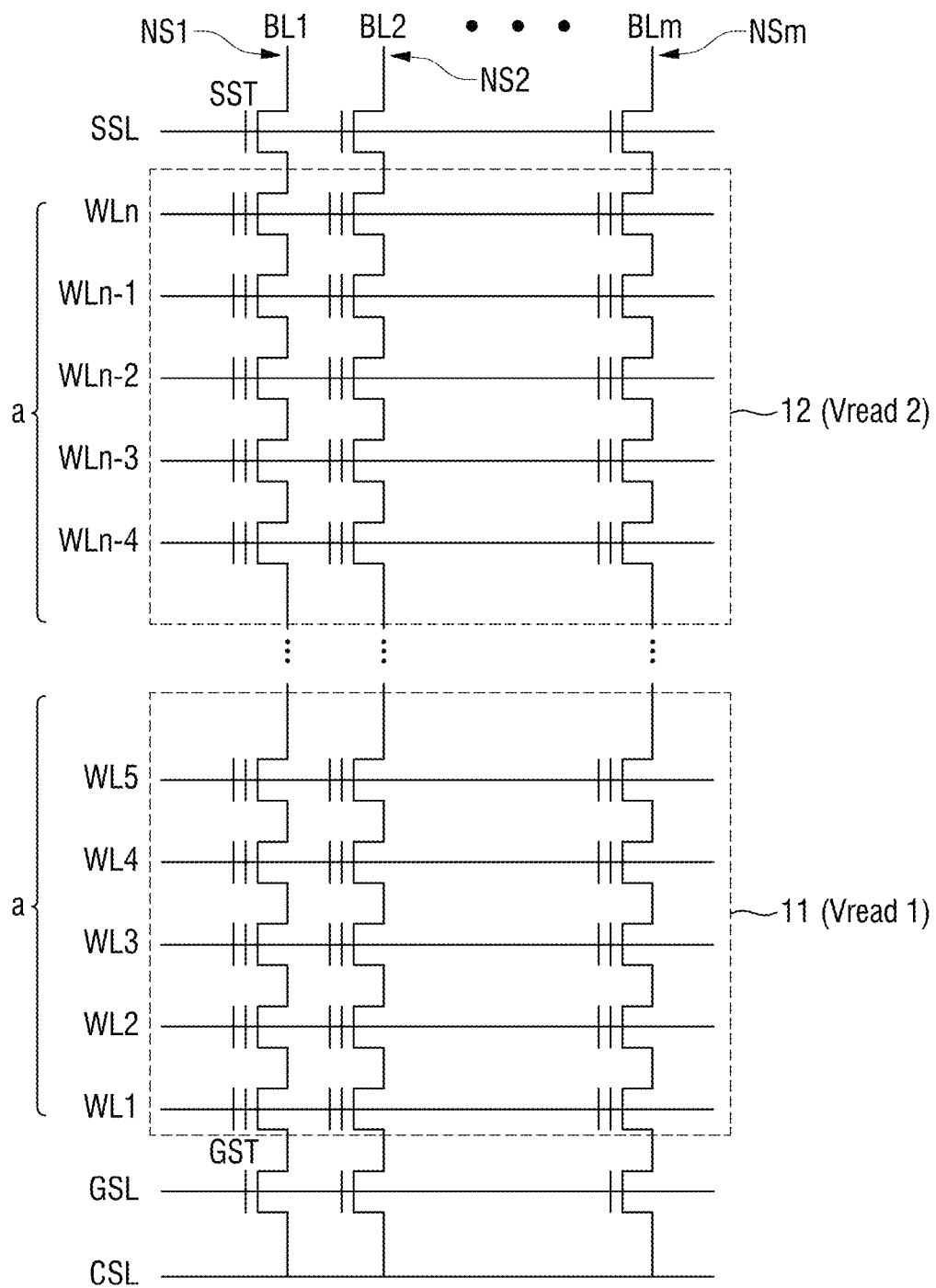

FIG. 13 is a diagram for explaining the operation of a nonvolatile memory device according to at least one example embodiment. The following description will focus on differences from FIG. 12.

Referring to FIG. 13, the nonvolatile memory device according to at least one example embodiment may include a memory block including a first memory group 11 and a second memory group 12, but the example embodiments are not limited thereto and there may be a greater or lesser number of memory groups included in the memory block.

The first memory group 11 may include a (a natural number of 2 or more) first word lines. The second memory group 12 may include a second word lines. That is, according to at least on example embodiment, the number of the first word lines and the number of the second word lines may be equal, and the first memory group 11 and the second memory group 12 may include the same number of word lines, but the example embodiments are not limited thereto, and the number of word lines may be different for the first memory group 11 and the second memory group 12.

When control logic 250 (see FIG. 2) simultaneously reads first memory cells connected to the first word lines included in the first memory group 11, it may simultaneously apply a first read voltage Vread 1 to the first word lines, but is not limited thereto. When the control logic 250 (see FIG. 2) simultaneously reads second memory cells connected to the second word lines included in the second memory group 12, it may simultaneously apply a second read voltage Vread to the second word lines, but is not limited thereto. The first read voltage Vread 1 and the second read voltage Vread 2 may be desired and/or predetermined voltages as described above in FIG. 12.

In addition, when the control logic 250 (see FIG. 2) performs an erase verify operation on the memory block including the first memory group 11 and the second memory group 12, it may apply the first read voltage Vread 1 to the first word lines included in the first memory group 11 and apply the second read voltage Vread 2 to the second word lines included in the second memory group 12 as described above in FIG. 12.

Figure 14:
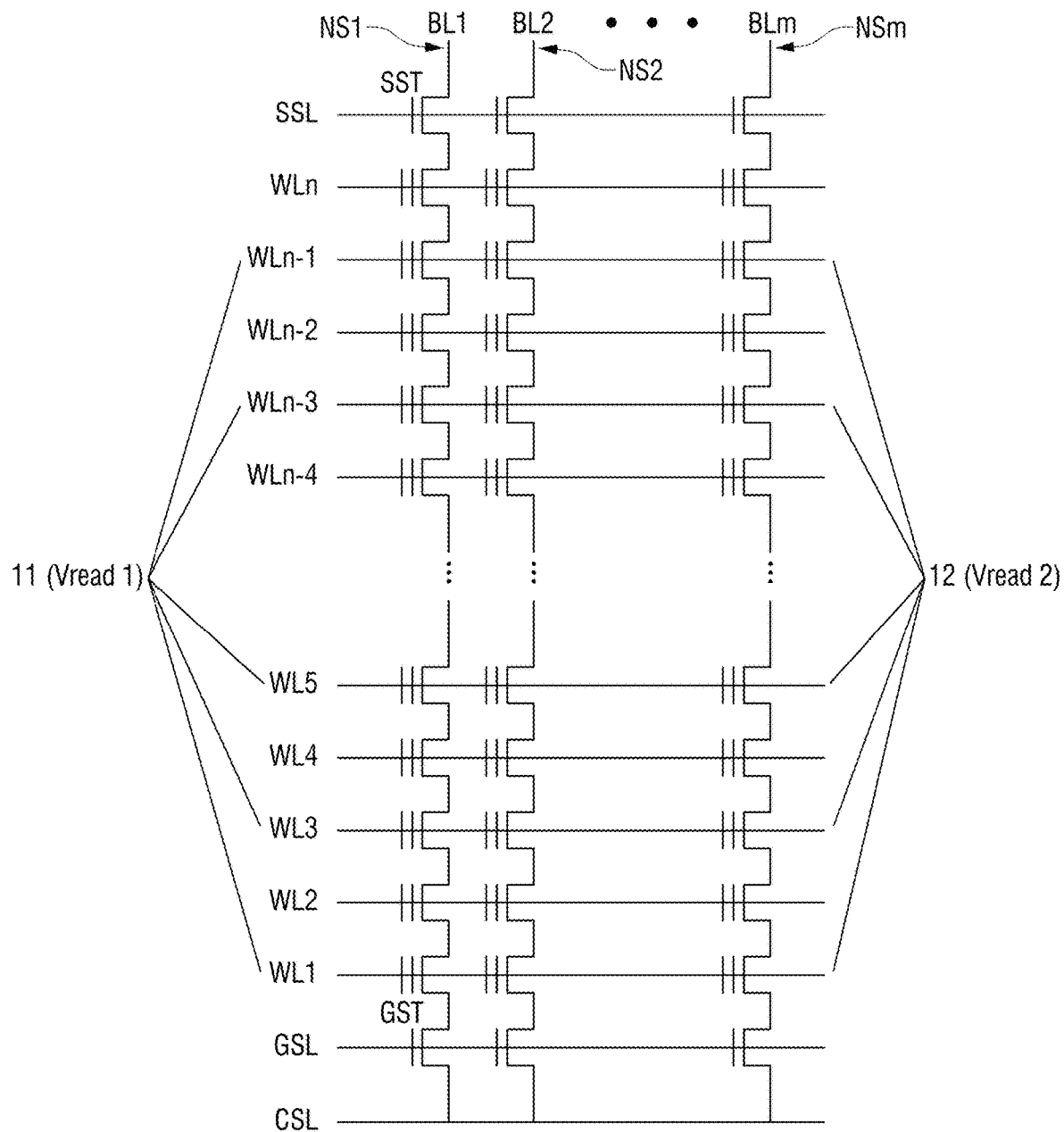

FIG. 14 is a diagram for explaining a method of operating a nonvolatile memory device according to at least one example embodiment. The following description will focus on differences from FIG. 12.

Referring to FIG. 14, the nonvolatile memory device according to at least one example embodiment may include a first memory group 11 including a plurality of first word lines WL1, WL3, WL5~WLn−1 (where n is an even number) and a second memory group 12 including a plurality of second word lines WL2, WL4, WL6~WLn, but the example embodiments are not limited thereto, and may include a greater or less number of memory groups and/or word lines per memory group. The first memory group 11 and the second memory group 12 may be included in one memory block. According to at least one example embodiment, the first word lines WL1, WL3, WL5~WLn−1 included in the first memory group 11 may include odd-numbered word lines, and the second word lines WL2, WL4, WL6~WLn included in the second memory group 12 may include even-numbered word lines, but are not limited thereto.

When the control logic 250 (see FIG. 2) simultaneously reads first memory cells connected to the first word lines WL1, WL3, WL5~WLn-1 included in the first memory group 11, it may simultaneously apply a first read voltage Vread 1 to the first word lines WL1, WL3, WL5~WLn-1. When the control logic 250 (see FIG. 2) simultaneously reads second memory cells connected to the second word lines WL2, WL4, WL6~WLn included in the second memory group 12, it may simultaneously apply a second read voltage Vread 2 to the second word lines WL2, WL4, WL6~WLn.

The above applies to some example embodiments of the inventive concepts, and the example embodiments are not limited thereto. The first word lines included in the first memory group 11 may also include even-numbered word lines, and the second word lines included in the second memory group 12 may also include odd-numbered word lines, etc.

Figure 15:
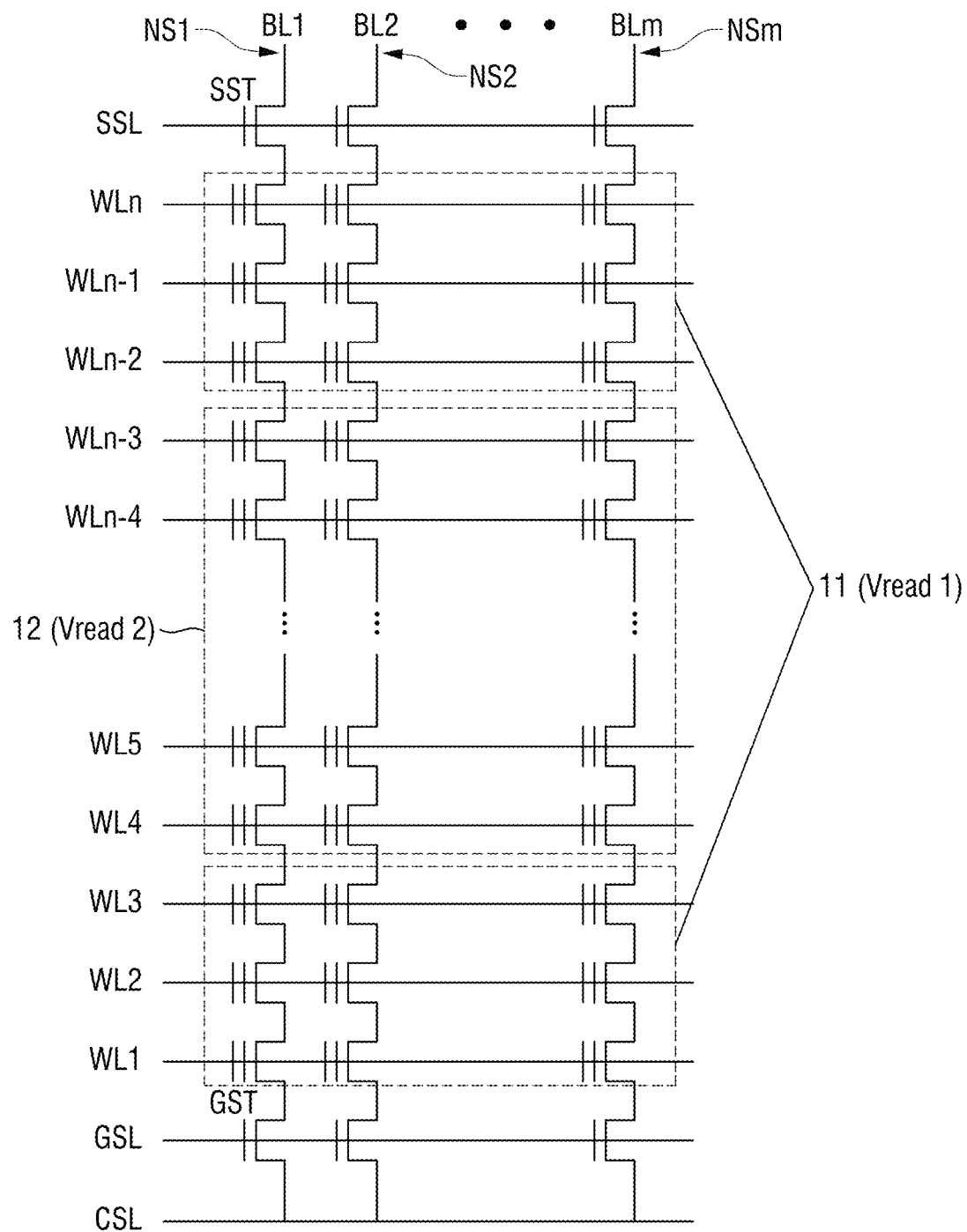

FIG. 15 is a diagram for explaining a method of operating a nonvolatile memory device according to at least one example embodiment. The following description will focus on differences from FIG. 12.

The nonvolatile memory device according to at least one example embodiment may include a first memory group 11 which includes a plurality of first word lines WLn-2, WLn-1 and WLn located at the top of a memory block and a plurality of first word lines WL1, WL2 and WL3 located at the bottom of the memory block and a second memory group 12 which includes a plurality of second word lines WL4 through WLn-3 excluding the first word lines WL1, WL2, WL3, WLn-2, WLn-1 and WLn, but the example embodiments are not limited thereto. The first memory group 11 and the second memory group 12 may be included in one block.

The second memory group 12 may be included between parts of the first memory group 11, the second memory group 12 may be included in the middle of the memory block, and the first memory group 11 may be outside the second memory group 12, but the example embodiments area not limited thereto.

The above applies to some example embodiments of the inventive concepts, and the example embodiments are not limited thereto. For example, the first memory group 11 may also be included between parts of the second memory group 12, the first memory group 11 may also be included in the middle of the memory block, and the second memory group 12 may also be included outside the first memory group 11, etc. In addition, the example embodiments are not limited to the numbers of word lines illustrated in the current drawing as long as the number of the first word lines WL1, WL2, WL3, WLn-2, WLn-1 and WLn and the number of the second word lines WL4 through WLn-3 are natural numbers equal to or greater than 2.

Figure 16:
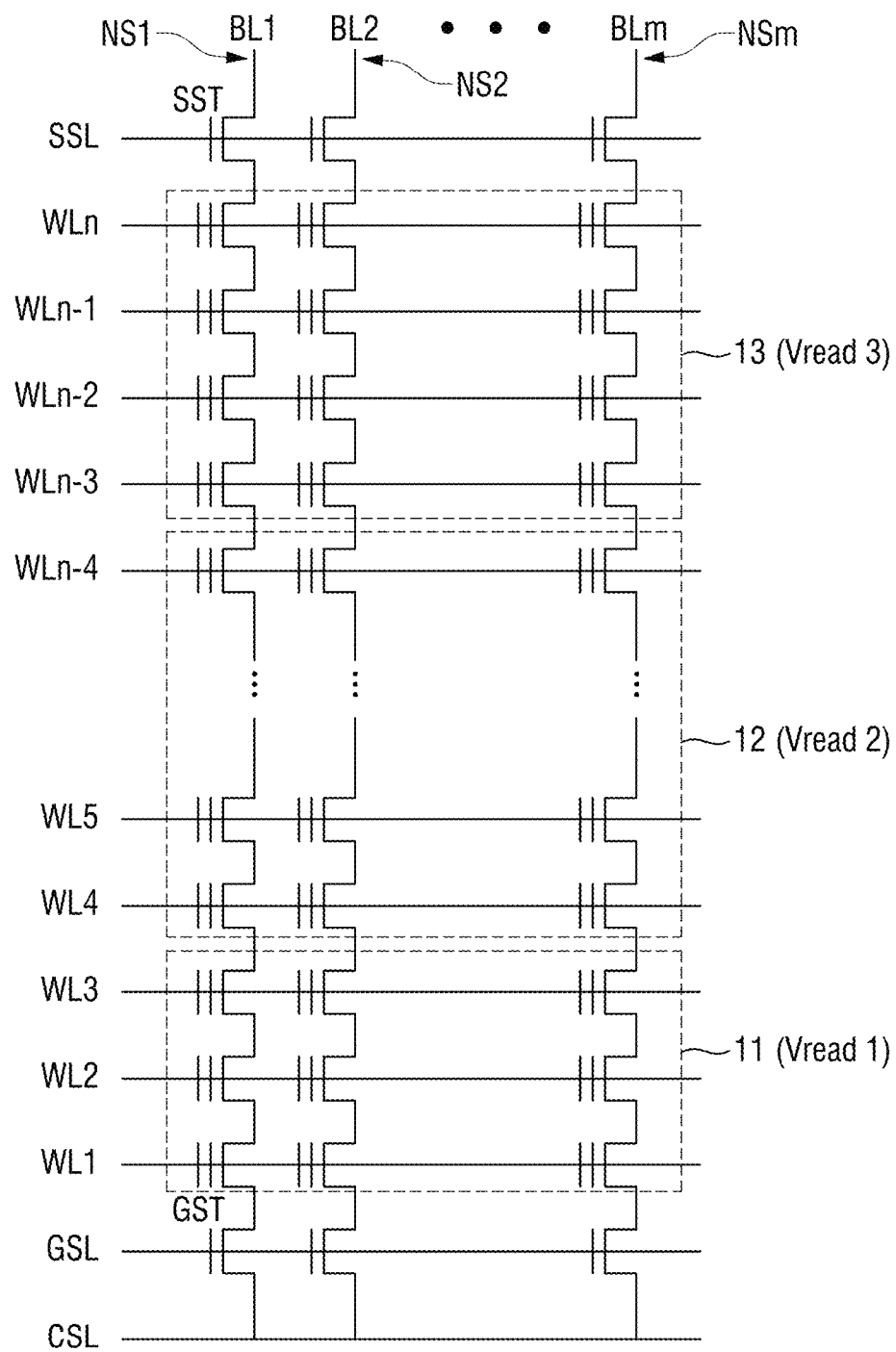

FIG. 16 is a diagram for explaining a method of operating a nonvolatile memory device according to at least one example embodiment. The following description will focus on differences from FIG. 12.

Referring to FIG. 16, the nonvolatile memory device according at least one example embodiment may include a first memory group 11 including a plurality of first word lines WL1 through WL3, a second memory group 12 including a plurality of second word lines WL4 through WLn-4, and a third memory group 13 including a plurality of third word lines WLn-3 through WLn, etc. The first memory group 11, the second memory group 12, and the third memory group 13 may be included in one memory block, but are not limited thereto. The first word lines WL1 through WL3, the second word lines WL4 through WLn-4, and the third word lines WLn-3 through WLn may have the same structure, but are not limited thereto.

When the control logic 250 (see FIG. 2) simultaneously reads first memory cells connected to the first word lines WL1 through WL3 included in the first memory group 11, it may simultaneously apply a first read voltage Vread 1 to the first word lines WL1 through WL3. When the control logic 250 (see FIG. 2) simultaneously reads second memory cells connected to the second word lines WL4 through WLn-4 included in the second memory group 12, it may simultaneously apply a second read voltage Vread to the second word lines WL4 through WLn-4. When the control logic 250 (see FIG. 2) simultaneously reads third memory cells connected to the third word lines WLn-3 through WLn, it may simultaneously apply a third read voltage Vread 3 to the third word lines WLn-3 through WLn.

Here, the first read voltage Vread 1 and the second read voltage Vread 2 are determined and/or set in the same way as described above. The third read voltage Vread 3 may be a desired voltage determined and/or set at any time, such as before the shipment of the nonvolatile memory device, etc., in consideration of the threshold voltage distribution of the third memory cells connected to the third word lines WLn-3 through WLn read by simultaneously applying a verify voltage to the third word lines WLn-3 through WLn. That is, the third read voltage Vread 3 may be an improved and/or optimal voltage for a case where the third word lines WLn-3 through WLn are simultaneously read.

The first read voltage Vread 1, the second read voltage Vread 2, and the third read voltage Vread 3 may be different voltages, etc.

When the control logic 250 (see FIG. 2) performs an operation, for example, an erase verify operation, etc., on the memory block including the first memory group 11, the second memory group 12 and the third memory group 13, it may control the erase verify operation to be performed on the first through third memory cells included in the first memory group 11, the second memory group 12 and the third memory group 13 by applying an erase verify voltage to each of the first memory group 11, the second memory group 12 and the third memory group 13. The control logic 250 (see FIG. 2) may apply the second read voltage Vread 2 to the second word lines WL4 through WLn-4 and apply the third read voltage Vread 3 to the third word lines WLn-3 through WLn after, or at the same time, as applying the first read voltage Vread 1 to the first word lines WL1 through WL3. That is, the control logic 250 (see FIG. 2) may apply the first through third read voltages Vread 1 through Vread 3 respectively to the first through third word lines WL1 through WLn at the same time.

The above applies to some example embodiments of the inventive concepts, but the example embodiments are not limited thereto. The nonvolatile memory device may also include N memory groups including a plurality of word lines. When a plurality of word lines included in each of first through $N^{th}$ memory groups are simultaneously read, a different read voltage may be applied to the word lines included in each of the first through $N^{th}$ memory groups. The read voltage may be determined based on the threshold voltage distribution of memory cells connected to the word lines included in each memory group when the memory cells are read.

Figure 17:
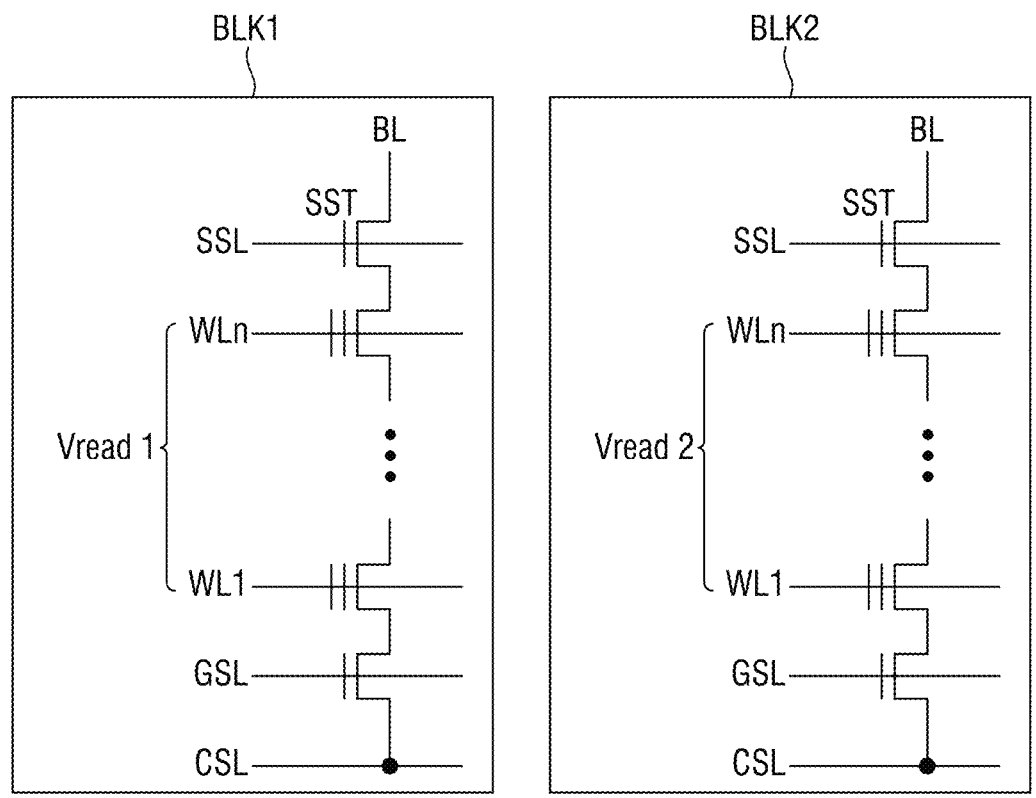
FIGS. 17 and 18 are diagrams for explaining the operation of nonvolatile memory devices according to some example embodiments.
Figure 18:
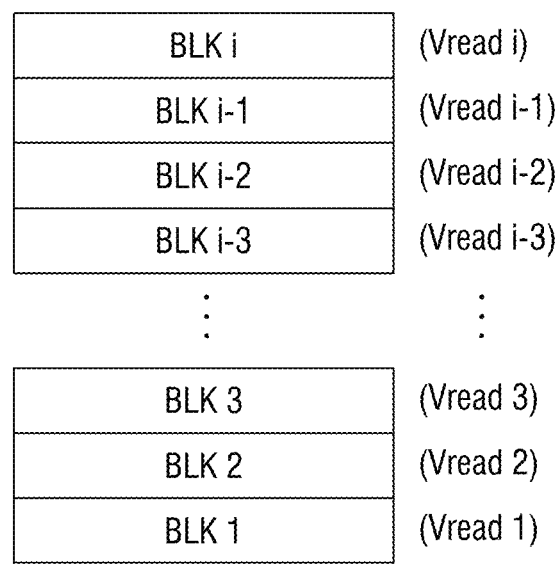

FIGS. 17 and 18 are diagrams for explaining the operation of nonvolatile memory devices according to some example embodiments when a memory group is a memory block.

Referring to FIG. 17, a nonvolatile memory device according to at least one example embodiment may include a first memory block BLK1 including a first memory group and a second memory block BLK2 including a second memory group, but is not limited thereto. That is, a memory group may be a memory block, etc.

When first memory cells connected to a plurality of first word lines WL1 through WLn included in the first memory block BLK1 are simultaneously read, a first read voltage Vread 1 may be applied to the first word lines WL1 through WLn. When second memory cells connected to a plurality of second word lines WL1 through WLn included in the second memory block BLK2 are simultaneously read, a second read voltage Vread 2 may be applied to the second word lines WL1 through WLn. Here, the first read voltage Vread 1 and the second read voltage Vread 2 may be different, or may be the same. The first read voltage Vread 1 and the second read voltage Vread 2 may be determined as described above and stored in control logic 250 (see FIG. 2).

For example, the first read voltage Vread 1 may be applied to the first word lines WL1 through WLn in an erase verify operation on the first memory block BLK1, and the second read voltage Vread 2 may be applied to the second word lines WL1 through WLn in an erase verify operation on the second memory block BLK2. That is, the erase verify voltages of the first memory block BLK1 and the second memory block BLK2 may be different, or may be the same.

FIG. 18 is a diagram for explaining the operation of a nonvolatile memory device according at least one example embodiment.

Referring to FIGS. 2 and 18, a memory cell array 260 may include a plurality of memory blocks BLK 1 through BLK i. The memory blocks BLK 1 through BLK i may have, for example, different erase verify voltages. An erase verify voltage for a first memory block BLK 1 may be a first read voltage Vread 1, and an erase verify voltage for an $i^{th}$ memory block BLK i may be an $i^{th}$ read voltage Vread i. The first through $i^{th}$ read voltages Vread 1 through Vread i may be different from each other.

Figure 19:
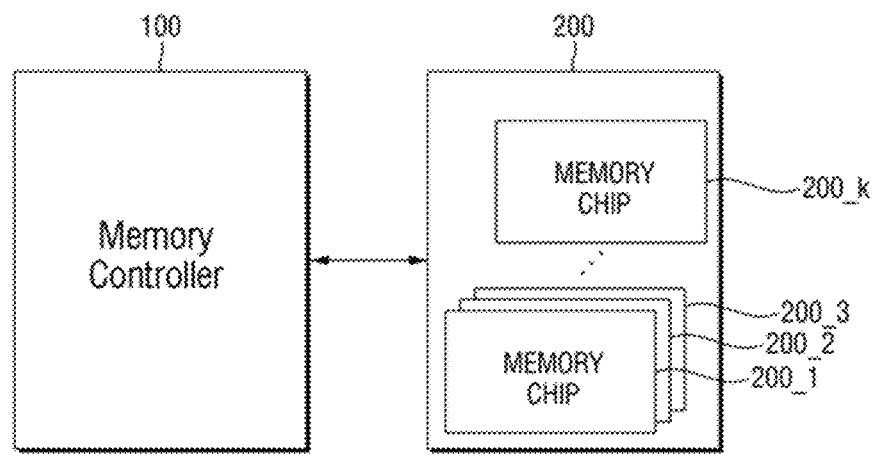
FIG. 19 is a block diagram of a nonvolatile memory system according to at least one example embodiment.
Figure 20:
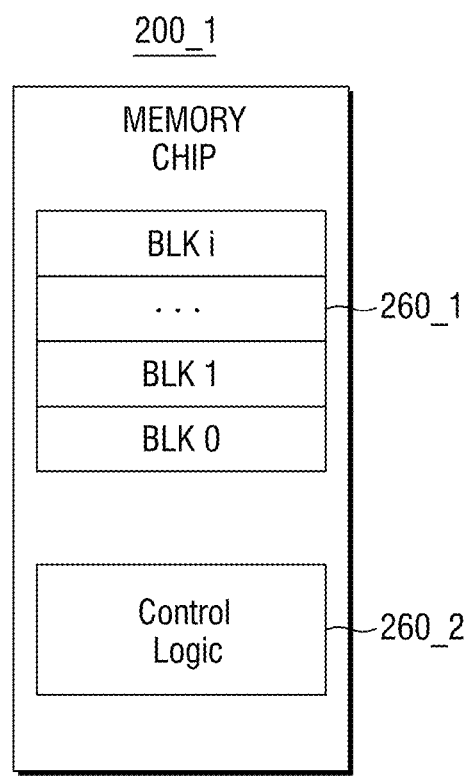
FIG. 20 is a block diagram of a memory chip of FIG. 19 according to at least one example embodiment.
Figure 21:
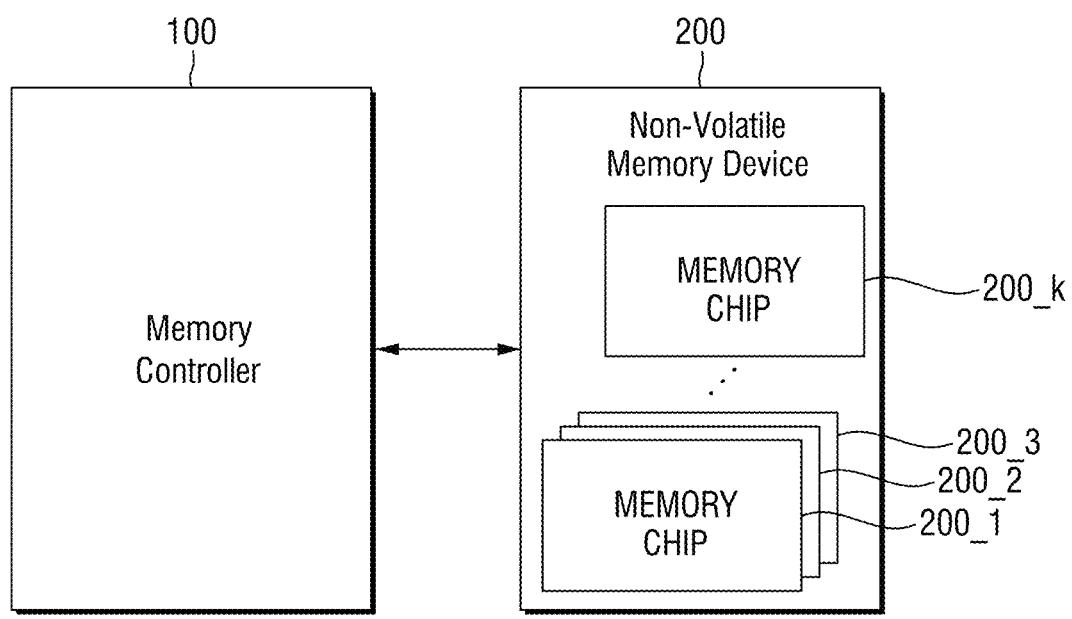
FIG. 21 is a diagram for explaining the operation of the nonvolatile memory device of FIG. 19 according to at least one example embodiment.

FIGS. 19 through 21 are diagrams for explaining the operation of a nonvolatile memory device according to some example embodiments when a memory group is a memory chip.

FIG. 19 is a block diagram of a nonvolatile memory system according to at least one example embodiment. Referring to FIG. 19, the nonvolatile memory device 200 according to at least one example embodiment may include a plurality of memory chips 200_1 through 200_K, but is not limited thereto. A memory group may be a memory chip, etc.

FIG. 20 is a block diagram of a memory chip 200_1 of FIG. 19. Referring to FIG. 20, the memory chip 200_1 may include a plurality of memory blocks 260_1 and control logic 260_2, but is not limited thereto. The control logic 260_2 may store a desired and/or predetermined read voltage to be applied to a plurality of word lines included in the memory blocks 260_1 when memory cells connected to the word lines are read at a desired time, such as before the shipment of the nonvolatile memory device 200, etc. The read voltage may be determined and/or set in advance according to the threshold voltage distribution of the connected memory cells read by applying a verify voltage to the word lines included in the memory blocks 260_1, but the example embodiments are not limited thereto.

Therefore, when the control logic 260_2 reads the memory cells connected to the word lines included in the memory chip 200_1, it may apply the desired and/or predetermined read voltage to the word lines.

FIG. 21 is a diagram for explaining the operation of the nonvolatile memory device 200 of FIG. 19 according to some example embodiments.

Referring to FIG. 21, when memory cells connected to a plurality of word lines included in the memory chips 200_1 through 200_k are simultaneously read, different desired and/or predetermined read voltages Vread 1 through Vread k may be applied to the word lines. For example, an erase verify voltage applied to memory blocks included in a first memory chip 200_1 may be a first read voltage Vread 1, and an erase verify voltage applied to memory blocks included in a $k^{th}$ memory chip 200_k may be a $k^{th}$ read voltage Vread k.

Therefore, the nonvolatile memory device 200 according to at least one example embodiment may apply a different erase verify voltage to each of the memory chips 200_1 through 200_k.

While various example embodiments of the inventive concepts have been particularly shown and described with reference to example embodiments thereof, it will be understood by those of ordinary skill in the art that various changes in form and detail may be made therein without departing from the spirit and scope of the inventive concepts as defined by the following claims. The example embodiments should be considered in a descriptive sense only and not for purposes of limitation.

What is claimed is:

1. A nonvolatile memory device comprising:
a memory including a first memory group and a second memory group, the first memory group including a plurality of first word lines, and the second memory group including a plurality of second word lines different from the first word lines; and
processing circuitry configured to,
simultaneously apply a sub-voltage to the first word lines,
determine a desired first read voltage based on a threshold voltage distribution of a plurality of first memory cells connected to the first word lines sensed in response to the application of the sub-voltage to the first word lines,
simultaneously apply the sub-voltage to the second word lines,
determine a desired second read voltage based on a threshold voltage distribution of a plurality of second memory cells connected to the second word lines sensed in response to the application of the sub-voltage to the second word lines,
apply the desired first read voltage to the first word lines while simultaneously reading the first memory cells connected to the first word lines, and
apply the desired second read voltage different from the desired first read voltage to the second word lines while simultaneously reading the second memory cells connected to the second word lines.

2. The device of claim 1, wherein the memory includes a first memory block and a second memory block, the first memory block including the first memory group, and the second memory block including the second memory group.

3. The device of claim 1, wherein the memory includes a memory block including the first memory group and the second memory group.

4. The device of claim 3, wherein the processing circuitry is further configured to:
apply the desired first read voltage to the first word lines and apply the desired second read voltage to the second word lines when performing an erase verify operation on the memory block.

5. The device of claim 4, wherein the processing circuitry is further configured to:
apply the desired first read voltage to the first word lines and apply the desired second read voltage to the second word lines at the same time.

6. The device of claim 3, wherein
the first word lines comprise odd-numbered word lines; and
the second word lines comprise even-numbered word lines.

7. The device of claim 3, wherein the number of the first word lines is equal to the number of the second word lines.

8. The device of claim 3, wherein at least one of the first word lines is between adjacent second word lines.

9. The device of claim 3, wherein the first word lines are above the second word lines.

10. The device of claim 3, wherein
the memory block includes a third memory group including a plurality of third word lines different from the first word lines and the second word lines; and
the processing circuitry is further configured to,
simultaneously apply the sub-voltage to the third word lines,
determine a desired third read voltage based on a threshold voltage distribution of a plurality of third memory cells connected to the third word lines sensed in response to the application of the sub-voltage to the third word lines,
apply the desired third read voltage to the third word lines while simultaneously reading the third memory cells connected to the third word lines, and
the desired third read voltage is different from the desired first read voltage and the desired second read voltage.

11. The device of claim 10, wherein the processing circuitry is further configured to:
apply the desired first read voltage to the first word lines and apply the desired third read voltage to the third word lines at the same time when performing an erase verify operation on the memory block.

12. The device of claim 11, wherein the processing circuitry is further configured to:
apply the desired first read voltage to the first word lines included in the first memory group and apply the desired second read voltage to the second word lines included in the second memory group when performing an erase verify operation on the memory.

13. The device of claim 1, wherein
the memory includes a first memory chip and a second memory chip, the first memory chip including the first memory group, and the second memory chip including the second memory group; and
the processing circuitry includes first processing circuitry and second processing circuitry,
the first processing circuitry is configured to apply the desired first read voltage to the first word lines while simultaneously reading the first memory cells connected to the first word lines, and
the second processing circuitry is configured to apply the desired second read voltage to the second word lines while simultaneously reading the second memory cells connected to the second word lines.

14. A nonvolatile memory device comprising:
a memory including a first memory group and a second memory group, the first memory group including a plurality of first word lines, and the second memory group including a plurality of second word lines different from the first word lines; and
processing circuitry configured to,
perform an erase operation by applying an erase voltage to the memory in response to receiving an erase command for the memory,
simultaneously apply a sub-voltage to the first word lines;
simultaneously apply the sub-voltage to the second word lines, and
apply a desired first read voltage to the first word lines and apply a desired second read voltage different from the desired first read voltage to the second word lines when performing an erase verify operation after the erase operation, wherein the desired first read voltage is determined based on the simultaneously applied sub-voltage to the first word lines, and the desired second read voltage is determined based on the simultaneously applied sub-voltage to the second word lines.

15. The device of claim 14, wherein the processing circuitry is further configured to:
determine the desired first read voltage based on a first threshold voltage distribution of a plurality of first memory cells connected to the first word lines sensed in response to the application of the sub-voltage to the first word lines; and
determine the desired second read voltage based on a second threshold voltage distribution of a plurality of second memory cells connected to the second word lines sensed in response to the application of the sub-voltage to the second word lines.

16. The device of claim 15, wherein the processing circuitry is further configured to:
apply the sub-voltage to a first word line of the first word lines;
determine a third threshold voltage distribution of the first memory cells connected to the first word line, sensed in response to the application of the sub-voltage to the first word line, the third threshold voltage distribution being different from the first threshold voltage distribution;
apply the sub-voltage to a second word line of the second word lines; and
determine a fourth threshold voltage distribution of the second memory cells connected to the second word line, sensed in response to the application of the sub-voltage to the second word line, the fourth threshold voltage distribution being different from the second threshold voltage distribution.

17. The device of claim 16, wherein a high threshold voltage value of the first threshold voltage distribution is greater than a high threshold voltage value of the third threshold voltage distribution, and a high threshold voltage value of the second threshold voltage distribution is greater than a high threshold voltage value of the fourth threshold voltage distribution.

18. The device of claim 14, wherein threshold voltages of a plurality of first memory cells connected to one of the first word lines are equal to threshold voltages of a plurality of second memory cells connected to one of the second word lines.

19. A nonvolatile memory device comprising:
a first memory chip including a first memory block and first processing circuitry; and
a second memory chip including a second memory block and second processing circuitry, wherein
the first memory block includes a plurality of first memory cells and a plurality of first word lines connected to the first memory cells,
the first processing circuitry is configured to perform a first erase operation by applying a first erase voltage to the first memory block based on a first erase command for the first memory block,
simultaneously apply a sub-voltage to the plurality of first word lines, and
apply a desired first read voltage to the plurality of first word lines while performing a first erase verify operation after performing the first erase operation, wherein the desired first read voltage is determined based on the simultaneously applied sub-voltage to the first word lines,
the second memory block comprises a plurality of second memory cells and a plurality of second word lines connected to the plurality of second memory cells, and
the second processing circuitry is configured to perform a second erase operation by applying a second erase voltage to the second memory block based on a second erase command for the second memory block,
simultaneously apply the sub-voltage to the plurality of second word lines, and
apply a desired second read voltage to the plurality of second word lines while performing a second erase verify operation after performing the second erase operation, wherein the desired second read voltage is determined based on the simultaneously applied sub-voltage to the second word lines, and the desired first read voltage is different from the desired second read voltage.

20. The device of claim 19, wherein
the first processing circuitry is further configured to,
    determine the desired first read voltage based on a first threshold voltage distribution of the plurality of first memory cells connected to the plurality of first word lines sensed in response to the application of the sub-voltage to the plurality of first word lines; and
the second processing circuitry is further configured to,
    determine the desired second read voltage based on a second threshold voltage distribution of the plurality of second memory cells connected to the plurality of second word lines sensed in response to the application of the sub-voltage to the plurality of second word lines.

* * * * *